United States Patent
Fabry

(10) Patent No.: US 8,358,524 B1
(45) Date of Patent: Jan. 22, 2013

(54) METHODS AND CIRCUITS FOR LIMITING BIT LINE LEAKAGE CURRENT IN A CONTENT ADDRESSABLE MEMORY (CAM) DEVICE

(75) Inventor: Martin Fabry, Mountain View, CA (US)

(73) Assignee: Netlogic Microsystems, Inc., Irvine, CA (US)

( * ) Notice: Subject to any disclaimer, the term of this patent is extended or adjusted under 35 U.S.C. 154(b) by 1003 days.

(21) Appl. No.: 12/215,875

(22) Filed: Jun. 27, 2008

Related U.S. Application Data

(60) Provisional application No. 60/937,781, filed on Jun. 29, 2007.

(51) Int. Cl.
*G11C 15/00* (2006.01)

(52) U.S. Cl. .................. 365/49.1; 365/203

(58) Field of Classification Search .............. 365/203, 365/49.17, 49.1, 49.11; 711/108
See application file for complete search history.

(56) References Cited

U.S. PATENT DOCUMENTS

| | | | |
|---|---|---|---|
| 5,031,094 A * | 7/1991 | Toegel et al. | 710/316 |
| 5,388,065 A | 2/1995 | Yoneda | |
| 6,078,987 A * | 6/2000 | Kongetira | 711/108 |
| 6,188,594 B1 * | 2/2001 | Ong | 365/49.1 |
| 6,839,256 B1 | 1/2005 | Proebsting et al. | |
| 6,906,377 B2 * | 6/2005 | Ni et al. | 257/315 |
| 6,906,937 B1 | 6/2005 | Nataraj | |
| 7,019,999 B1 | 3/2006 | Srinivasan et al. | |
| 7,133,302 B1 | 11/2006 | Srinivasan et al. | |
| 7,417,881 B2 | 8/2008 | Srinivasan et al. | |
| 7,852,652 B1 * | 12/2010 | Fabry | 365/49.17 |
| 7,944,724 B2 | 5/2011 | Chu | |
| 7,963,577 B2 * | 6/2011 | Wolf | 292/241 |
| 2001/0026464 A1 * | 10/2001 | Hata et al. | 365/49 |

OTHER PUBLICATIONS

Notice of Unpublished Applications referencing U.S. Appl. 12/431,332 and 12/215,747.

* cited by examiner

*Primary Examiner* — Douglas King
(74) *Attorney, Agent, or Firm* — Sterne, Kessler, Goldstein & Fox, PLLC

(57) ABSTRACT

A content addressable memory (CAM) device can include a number of bit line. One or more of the bit lines can be connected to storage circuits of CAM cells in a corresponding column. Each CAM cell can include compare circuits that compare a stored value one or more compare data values. An isolation circuit can have a controllable impedance path connected between the bit line and a precharge voltage node and can be controlled by application of a potential at a control node. A control circuit can be coupled to the control node and can switch the isolation circuit from a high impedance state to a low impedance state in response to, and no later than the start of, an access operation.

27 Claims, 9 Drawing Sheets

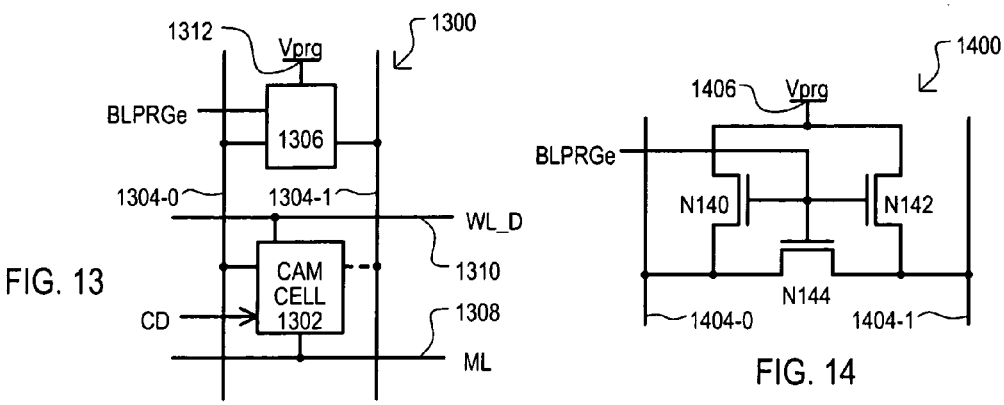
FIG. 13
FIG. 14
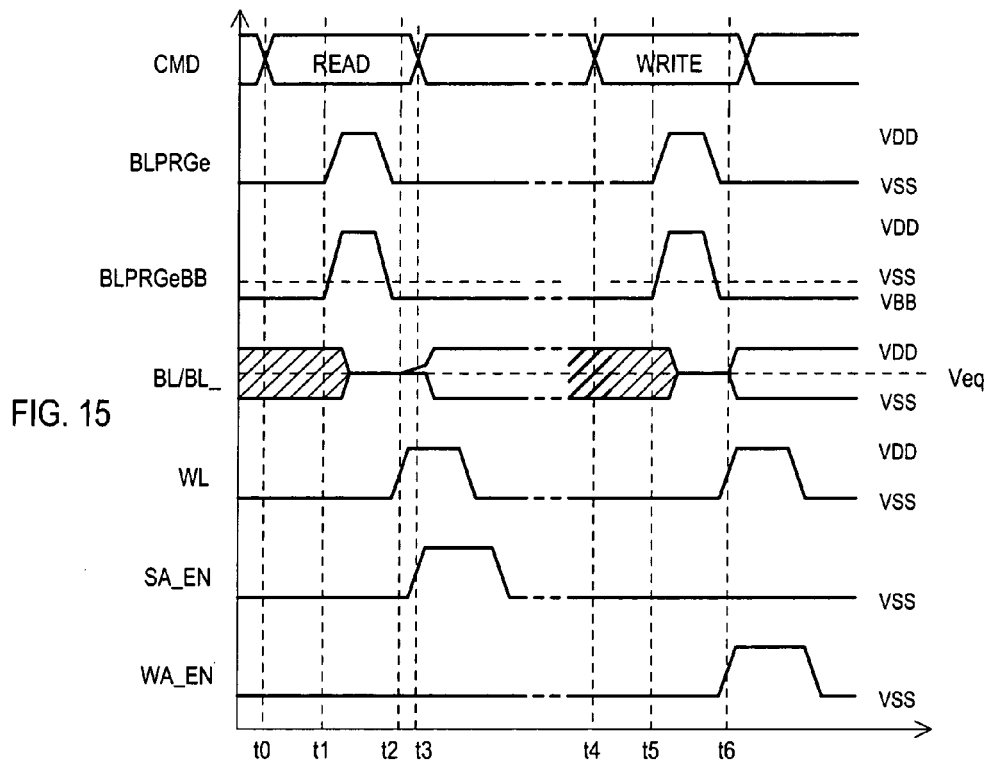
FIG. 15
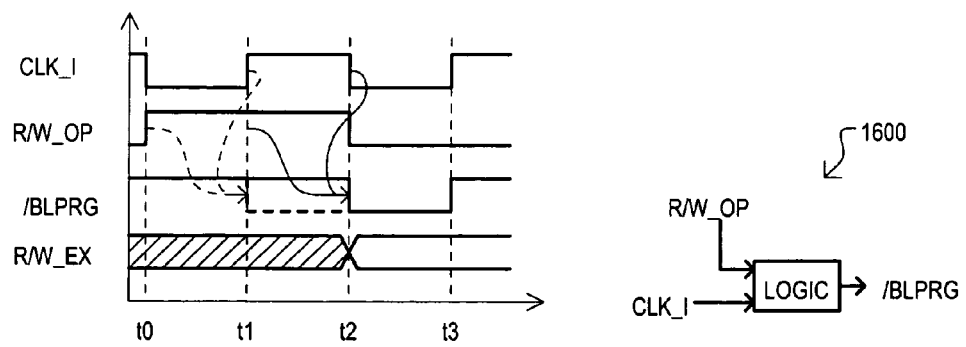
FIG. 16A
FIG. 16B

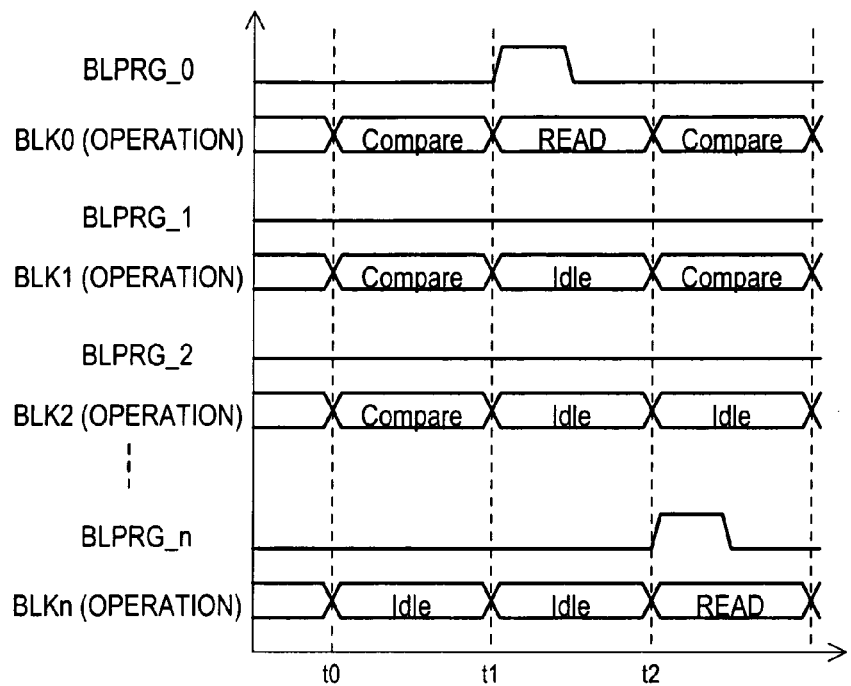
FIG. 21
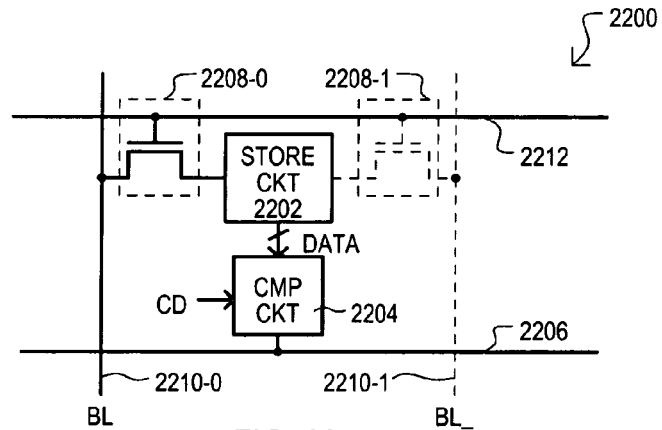
FIG. 22
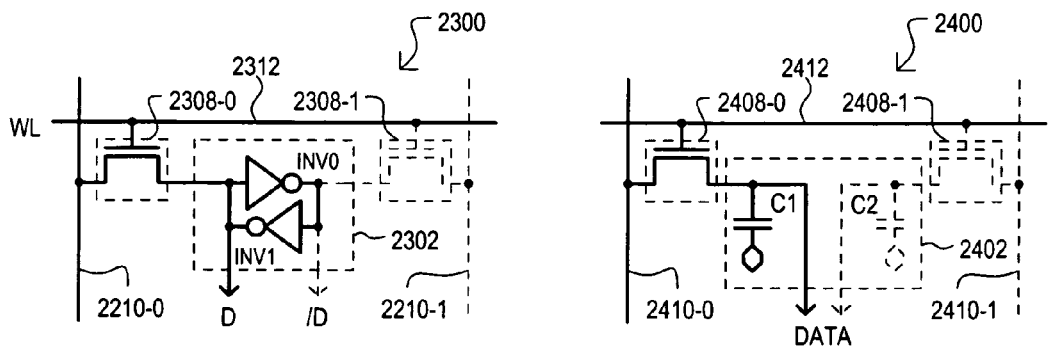
FIG. 23
FIG. 24

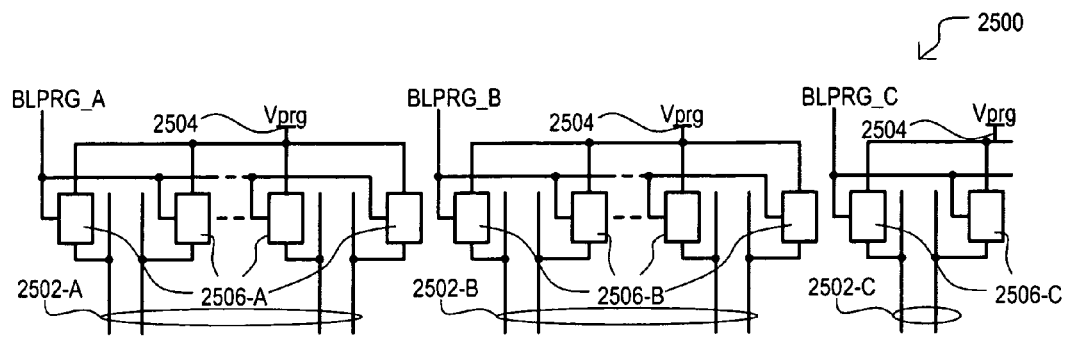
FIG. 25A
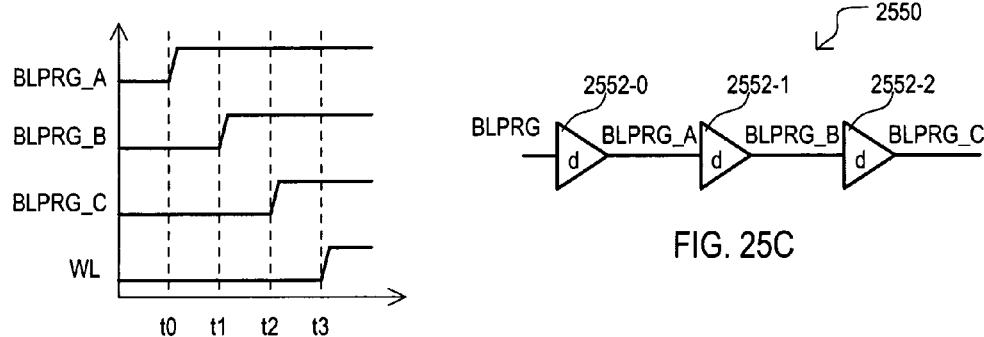
FIG. 25B
FIG. 25C
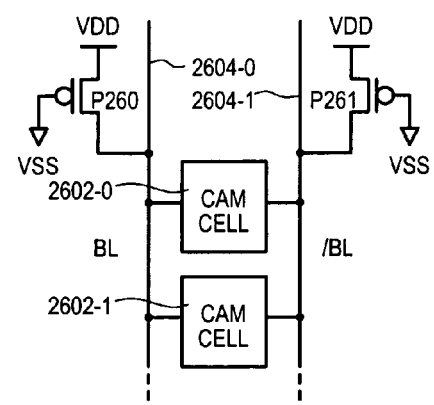
FIG. 26 (BACKGROUND ART)

METHODS AND CIRCUITS FOR LIMITING BIT LINE LEAKAGE CURRENT IN A CONTENT ADDRESSABLE MEMORY (CAM) DEVICE

This application claims the benefit of U.S. Provisional Patent Application Ser. No. 60/937,781, filed on Jun. 29, 2007, the contents of which are incorporated by reference herein.

TECHNICAL FIELD

The present invention relates generally to content addressable memory (CAM) devices, and more particularly to controlling bit lines, like those that provide data to and/or from CAM cells for subsequent comparison with compare data values.

BACKGROUND OF THE INVENTION

Content addressable memory (CAM) devices, sometimes referred to as "associative memories," can receive a compare data value (sometimes referred to as a comparand or search key), and compare such a value against a number of stored data values. In most configurations, such an operation can match a compare data value against a very larger number of stored data values (e.g., thousands or millions), essentially simultaneously.

Such rapid compare functions have resulted in CAM devices enjoying wide application in various packet processing hardware devices, such as routers and network switches, to name just two. In a typical packet processing operation, a device can receive a packet. The packet can include a "header" having various data fields that indicate how the packet should be processed. The hardware device can use a matching function, provided by a CAM device, to compare one or more header fields to stored data values that can indicate how the packet is to be processed.

Many CAM device configurations can include a number of CAM memory cells arranged in a logical fashion (e.g., rows, words, etc.) to store data values for comparison with a search key. Such CAM memory cells typically include a storage circuit for storing one or more bit values as well as a compare circuit, for comparing the stored data value(s) with corresponding portions of a received search key.

CAM devices are typically manufactured in integrated circuit form, as stand alone memory devices, or as some portion of an integrated circuit providing other functions. For many integrated circuit applications, including those that include CAM memory cells, current draw can be an important feature. That is, it is desirable to reduce current draw in an integrated circuit to as great an extent as possible. Reductions in current draw can reduce power supply requirements, heat sinking requirements, and battery life in the case of portable applications.

To better understand various aspects of the present invention, a conventional CAM device circuit will briefly be described.

Referring now to FIG. 26, an example of a conventional CAM cell column is shown in a block schematic diagram and designated by the general reference character 2600. Conventional CAM column 2600 includes a number of CAM cells (two shown in the figure as 2602-0 and 2602-1) connected to complementary bit lines 2604-0 and 2604-1. CAM cells (2602-0 and 2602-1) can include both storage circuits and compare circuits. Data values can be written to storage circuits, or read from storage circuits via bit lines (2604-0 and 2604-1). In particular, in a write or read operation one bit line (e.g., 2604-0) can carry a data value, while the other bit line (e.g., 2604-1) can carry a complementary data value.

In many conventional CAM device configurations, sense amplifiers for reading data from a bit line pair and/or write amplifiers for writing data to a bit line pair are designed to begin sense operations with both bit lines at a predetermined precharge level (e.g., a high power supply voltage VDD). In such an arrangement, during a read operation, according to a data value stored in a read CAM cell, a sense amplifier can drive one bit line low while the other remains high. Similarly, in a write operation, a write amplifier can drive one bit line low, while the other remains high.

In order to ensure that bit lines are at an optimal level for reading or writing, a conventional CAM cell column 2600 can include "leaker" precharge transistors P260 and P261. Transistor P260 can have a source connected to a high power supply voltage VDD, a drain connected to bit line 2604-0 and a gate connected to a low power supply voltage VSS. Similarly, transistor P261 can have a source connected to a high power supply voltage VDD, a drain connected to bit line 2604-1 and a gate connected to low power supply voltage VSS. In such an arrangement, leaker transistors P260/P261 are "always on" devices, maintaining bit lines (2604-0 and 2604-1) at a VDD level. Because CAM cells (2602-0 and 2602-1) connected to bit lines (2604-0 and 2604-1) can draw some leakage current, transistors P260 and/or P261 may continuously draw some amount of current.

Another example of a CAM bit line control circuit is shown in U.S. Pat. No. 6,906,937 issued to Bindiganavale S. Nataraj on Jun. 14, 2005 (hereinafter Nataraj). Nataraj shows a bit line control circuit that adjusts the charge current for bit lines in response to a bit line control signal.

BRIEF DESCRIPTION OF THE DRAWINGS

FIG. 13 is a block schematic diagram of a CAM device according to yet another embodiment of the invention.

FIG. 14 is a schematic diagram of a bit line isolation/equalization circuit that can be included in the embodiment of FIG. 13.

FIG. 15 is a timing diagram showing an operation of a CAM device like that of FIG. 13.

FIG. 16A is a timing diagram showing a CAM device operation according to one embodiment. FIG. 16B is a block schematic diagram of a circuit that can be used in an embodiment like that of FIG. 16A.

FIG. 21 is a timing diagram showing operations of a CAM device like that FIGS. 19 and/or 20.

FIG. 22 shows a CAM cell that can be included in embodiments of the invention.

FIG. 23 shows a storage circuit that can be included in a CAM cell like that of FIG. 22.

FIG. 24 shows another storage circuit that can be included in a CAM cell like that of FIG. 22.

FIG. 25A is a block schematic diagram of a bit line isolation circuit according to another embodiment of the invention. FIG. 25B is a timing diagram showing the operation of a circuit like that of FIG. 25A. FIG. 25C is a signal generation circuit that can be included in embodiments like those shown in FIGS. 25A and 25B.

FIG. 26 is a schematic diagram of a conventional CAM device column.

DETAILED DESCRIPTION

Various embodiments of the present invention will now be described in detail with reference to a number of drawings. The embodiments include a content addressable memory (CAM) device, CAM circuits, and methods for isolating bit lines from a precharge voltage until, or prior to, operations that access storage circuits within the CAM cells.

Figure 1:
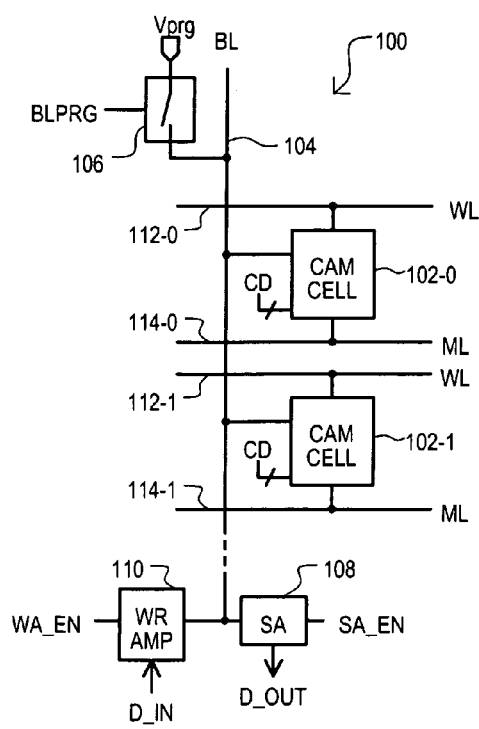
FIG. 1 is a block schematic diagram of a content addressable memory (CAM) device according to a first embodiment of the invention.

Referring now to FIG. 1, a CAM device according to a first embodiment is shown in a block schematic diagram and designated by the general reference character 100. A CAM device 100 can include a number of CAM cells (two shown as 102-0 and 102-1), one or more bit lines (one shown as 104), a bit line isolation circuit 106, a sense amplifier 108, and a write amplifier 110. Each of CAM cells (102-0 and 102-1) can be connected to a word line (112-0 and 112-1, respectively) and a match line (114-0 and 114-1, respectively). CAM cells (102-0 and 102-1) can compare stored data values to received compare data values (CD). According to such a comparison, a CAM cell (102-0 and 102-1) can provide a match or mismatch indication on a corresponding match line (114-0 and 114-1).

Data values stored by CAM cells (102-0 and 102-1) can include data for comparison and in some configurations, additional mask data. As but two particular examples, in the case of a binary CAM cell, stored data may include data for comparison with a compare data value. In the case of a ternary CAM cell, such data can further include mask data information for forcing one type of compare indication (e.g., match or mismatch) regardless of a stored data value.

In the arrangement of FIG. 1, storage locations within CAM cells (102-0 and 102-1) can be accessed by way of a corresponding bit line 104 and word line (112-0 or 112-1). Such accesses can include read operations, in which a CAM cell is accessed to place a stored data value onto bit line 104, as well as write operations, in which a CAM cell is accessed to place data on a bit line 104 into a CAM cell. In a read operation, a sense amplifier 108 can amplify a value placed on the bit line 104 by a CAM cell (102-0 or 102-1). In a write operation, a write amplifier 110 can drive bit line 104 to allow a selected CAM cell (102-0 or 102-1) to store the driven value.

A bit line isolation circuit 106 can provide a high or low impedance path between a precharge voltage Vprg and a bit line 104 in response to a signal BLPRG.

In the example of FIG. 1, it is preferable that bit line 104 be placed at a precharge voltage Vprg for a read and/or a write operation. More particularly, it may be desirable that bit line 104 be at precharge voltage Vprg prior to and/or while a CAM cell is connected to bit line 104 by activation of its corresponding word line (112-0 and 112-1). However, unlike a conventional arrangement like that of FIG. 26, according to embodiments of the invention, a bit line isolation circuit 106 can electrically isolate a bit line 104 from a precharge voltage Vprg. Then, in response to an access operation, a bit line isolation circuit 106 can provide a low impedance path to place bit line 104 at a precharge voltage Vprg.

Thus, prior to an access operation, a bit line isolation circuit 106 can isolate a bit line 104 from a precharge voltage Vprg. This is in contrast to conventional arrangements that can include an "always on" device that can continuously draw some amount of current.

Figure 2A:
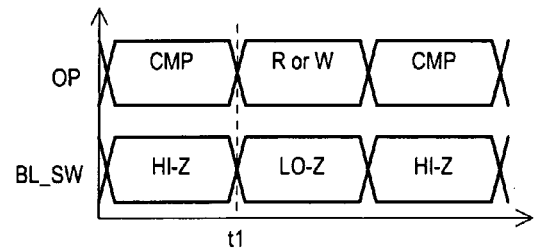
FIGS. 2A to 2C are timing diagrams showing various ways in which bit line isolation circuits can be controlled according to embodiments of the invention.
Figure 2B:
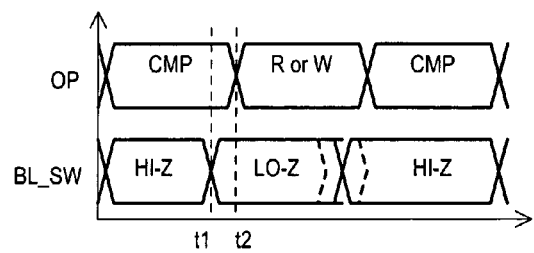
Figure 2C:
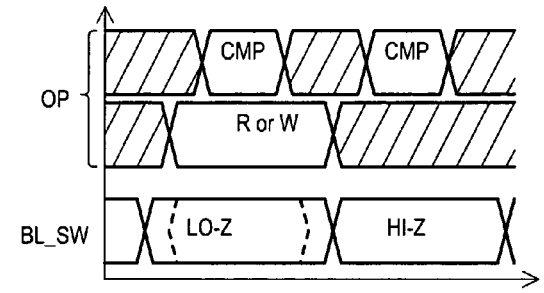

Various examples of possible operations for a CAM device like that of FIG. 1 are shown in FIGS. 2A to 2C. FIGS. 2A to 2C are timing diagrams showing how a bit line isolation circuit (e.g., 106) can be controlled in access operations.

Referring now to FIG. 2A, a timing diagram shows a first example of an operation for a CAM device 100 like that of FIG. 1. FIG. 2A includes waveforms OP and BL_SW. Waveform OP can represent an operation executed by a CAM device. In the particular example of FIG. 2A, waveform OP shows compare operations (CMP) as well as an access operation (R or W). A compare operation CMP can apply compare data values (CD) to CAM cells (102-0 and 102-1) to generate match results on match lines (114-0 and 114-1). An access operation (R or W) can access one or more CAM cells in order to read data from such cells, or write data to such cells. Waveform BL_SW shows a state of an impedance path of bit line isolation circuit 106 between bit line 104 and precharge voltage Vprg.

Prior to time t1, a non-access operation (e.g., compare) is taking place. During this time, bit line isolation circuit 106 has a high impedance (Hi-Z), and thus limits the amount of leakage current drawn by a bit line, as compared to conventional arrangements that supply a current at all times.

At about time t1, an access operation (e.g., read or write) can take place. At this time, bit line isolation circuit 106 can switch from a high impedance state (HI-Z) to a low impedance state (LO-Z), thus connecting bit line 104 to precharge voltage Vprg. This can place bit line 104 at a value best suited for the access operation.

Referring now to FIG. 2B, a timing diagram shows a second example of an operation for a CAM device 100 like that of FIG. 1. FIG. 2B includes the same general waveforms as FIG. 2A.

FIG. 2B can differ from the arrangement of FIG. 2A in that a bit line isolation circuit 106 can switch from a high impedance state to a low impedance state prior to an access operation. Thus, in FIG. 2B waveform BL_SW changes from "HI-Z" to "LO-Z" at time t1. Subsequently, at time t2, an access operation can start.

An operation like that of FIG. 2B can provide advantageous lead time in the event a bit line 104 requires a certain amount of time to reach a desired precharge level.

FIG. 2B also illustrates how a bit line isolation circuit 106 can switch from a low impedance state to a high impedance state before, coincident with, or after the end of an access operation. Thus, FIG. 2B shows dashed lines indicating such a switching point for a bit line isolation circuit.

Referring now to FIG. 2C, a timing diagram shows a third example of an operation for a CAM device 100 like that of FIG. 1. FIG. 2C includes the same general waveforms as FIG. 2A.

FIG. 2C can differ from the arrangement of FIG. 2A in that the CAM device shown can execute different operations concurrently. More particularly, a CAM device can perform a non-access operation (e.g., compare) while performing an access operation (e.g., read or write). In such a case, if an access operation is to take place, a bit line isolation circuit 106 can operate in the manners described above, regardless of any other concurrent non-access operations. Thus, FIG. 2C shows waveform BL_SW changes from "HI-Z" to "LO-Z" at time t1, even though a compare operation is also taking place.

In this way, a bit line isolation circuit can electrically isolate a bit line until an access operation, or just prior to such an access operation. This can reduce current drawn by a CAM device.

It is noted that while FIG. 1 shows but one bit line connected to CAM cells of a column, other embodiments can include multiple such bit lines. Various examples of such arrangements are shown in FIGS. 3 to 7.

Figure 3:
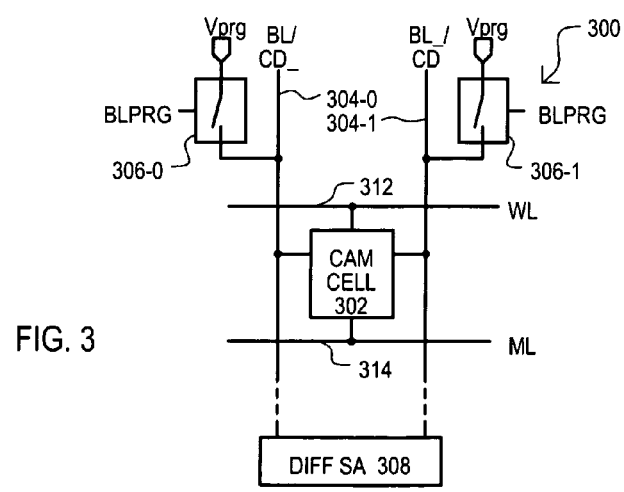
FIG. 3 is a block schematic diagram of a CAM device according to another embodiment of the invention.

Referring now to FIG. 3, a CAM device is shown in a block schematic diagram and designated by the general reference character 300. A CAM device 300 can include some of the same general items as FIG. 1, thus like items are referred to by the same reference character but with the first digit being a "3" instead of a "1".

CAM device 300 can differ from that of FIG. 1 in that it can include a bit line pair (304-0 and 304-1) connected to each CAM cell. Such an arrangement can allow for differential sensing (reading) of data values stored within a CAM cell 300, which can be more reliable and/or faster than "single" ended sensing. Thus, a CAM device 300 can include a differential sense amplifier 308 connected to bit line pair 304-0/1. A sense amplifier 308 can operate as both a read and write amplifier, or a separate write amplifier (not shown), could be included.

CAM device 300 can include a bit line isolation circuit 306-0 and 306-1 corresponding to each bit line 304-0 and 304-1. Each bit line isolation circuit (306-0 and 306-1) can operate in the various ways shown above in FIGS. 1 to 2C.

The arrangement of FIG. 3 can further differ from that of FIG. 1 in that bit lines (304-0 and 304-1) may also serve as compare data lines, providing compare data to a CAM cell 302. Of course, in such an arrangement, compare and access operations could not occur at the same time, as shown in FIG. 2C.

In this way, complementary bit line pairs and/or bit lines the provide both compare data and data for storage in memory cells can be switched from a high impedance state to a low impedance state prior to, or at the start of an access operation.

Figure 4:
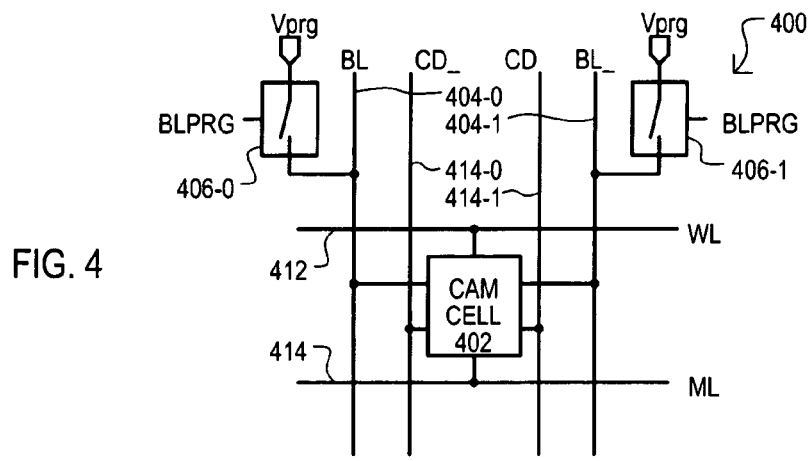
FIG. 4 is a block schematic diagram of a CAM device according to another embodiment of the invention.

Referring now to FIG. 4, another CAM device is shown in a block schematic diagram and designated by the general reference character 400. A CAM device 400 can include some of the same general items as FIG. 3, thus like items are referred to by the same reference character but with the first digit being a "4" instead of a "3".

CAM device 400 can differ from that of FIG. 3 in that it can include a compare data line pair 414-0 and 414-1 separate from bit line pair 404-0 and 404-1. A compare data line pair 414-0/1 can provide compare data to a CAM cell 402, while bit line pair 404-0/1 can access storage circuits within CAM cell 402.

In such an arrangement, CAM device 400 can include a bit line isolation circuit 406-0 and 406-1 connected to bit lines 404-0 and 404-1, respectively, but not connected to compare data lines 414-0/1. Each bit line isolation circuit (406-0 and 406-1) can operate in the same ways as shown above in FIGS. 1 to 2C.

Figure 5:
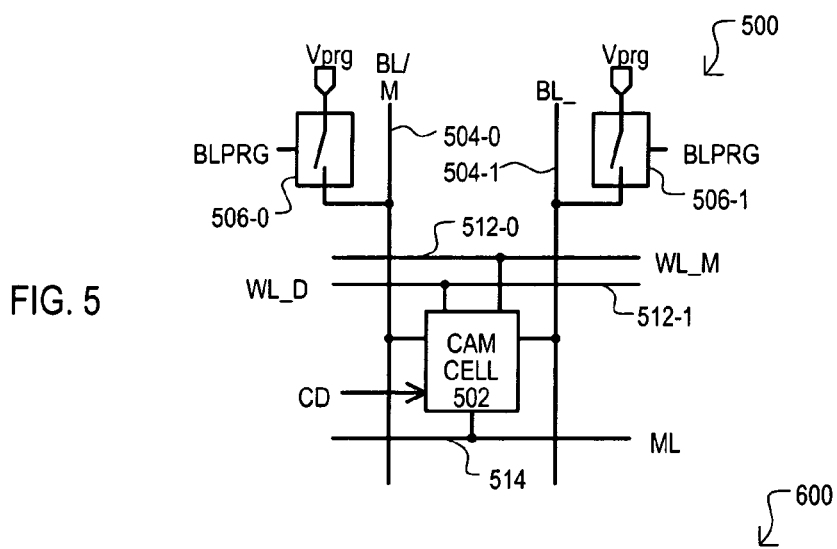
FIG. 5 is a block schematic diagram of a CAM device according to another embodiment of the invention.

Referring now to FIG. 5, another CAM device is shown in a block schematic diagram and designated by the general reference character 500. A CAM device 500 can include some of the same general items as FIG. 3, thus like items are referred to by the same reference character but with the first digit being a "5" instead of a "3".

CAM device 500 can differ from that of FIG. 3 in that a CAM cell 502 can be a ternary CAM cell, and bit line pair 504-0 and 504-1 can provide more than one bit value to a CAM cell to provide a maskable data value. In the particular arrangement of FIG. 5, a CAM cell 500 can include two word lines 512-0 and 512-1, one for each bit value accessed within a CAM cell 502. As but two very particular examples, a CAM cell 502 can be a value(V)/mask(M) type CAM cell that stores a V bit for comparison with a corresponding compare data bit, where a comparison can be selectively masked (forced to a match or mismatch state) according to an M bit. Alternatively, a CAM cell 502 can be an "XY" type CAM cell that stores X and Y bits, having states that can match one compare data bit (e.g., 0 or 1), and a state that can mask a compare operation.

In the arrangement of FIG. 5, CAM device 500 can include a bit line isolation circuit 506-0 and 506-1 connected to bit lines 504-0 and 504-1, respectively. Each bit line isolation circuit (506-0 and 506-1) can operate in the same ways as shown above in FIGS. 1 to 2C. However, it is understood that an access operation can be to any of multiple bits stored within CAM cell 502.

In this way, one or more bit lines that provide multiple bit values to a ternary CAM cell can be switched from a high impedance state to a low impedance state prior to, or at the start of an access operation.

Figure 6:
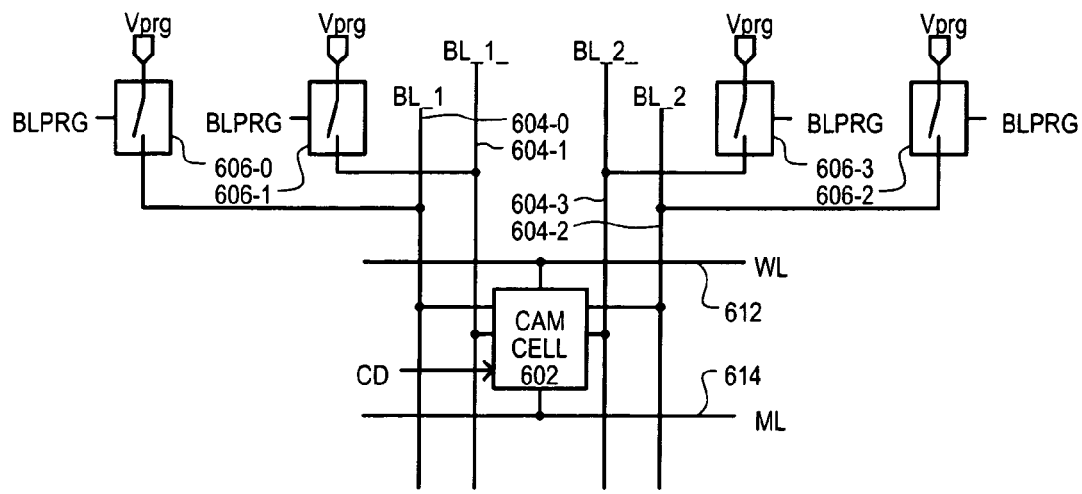
FIG. 6 shows a block schematic diagram of a CAM device according to another embodiment of the invention.

Referring now to FIG. 6, another CAM device is shown in a block schematic diagram and designated by the general reference character 600. A CAM device 600 can include some of the same general items as FIG. 3, thus like items are referred to by the same reference character but with the first digit being a "6" instead of a "3".

CAM device 600 can differ from that of FIG. 3 in that a CAM cell 602 can be a ternary CAM cell and two sets of bit line pairs 604-0/1 and 604-2/3 can be provided for access to multiple storage locations within CAM cell 602, essentially simultaneously. Thus, CAM cell 602 can include a single word line 612, that when activated, can connect bit line pairs 604-0/1 and 604-2/3 to different storage locations within CAM cell 602.

Each bit line 604-0 to 604-4 can be isolated from, or connected to, a precharge voltage Vprg by a corresponding bit line isolation circuit (604-0 to 604-3). In the particular example of FIG. 6, each bit line isolation circuit can operate in the same ways as shown above in FIGS. 1 to 2C.

In this way, bit lines for providing multiple data values to a CAM cell in parallel can be switched from a high impedance state to a low impedance state prior to, or at the start of an access operation.

Figure 7A:
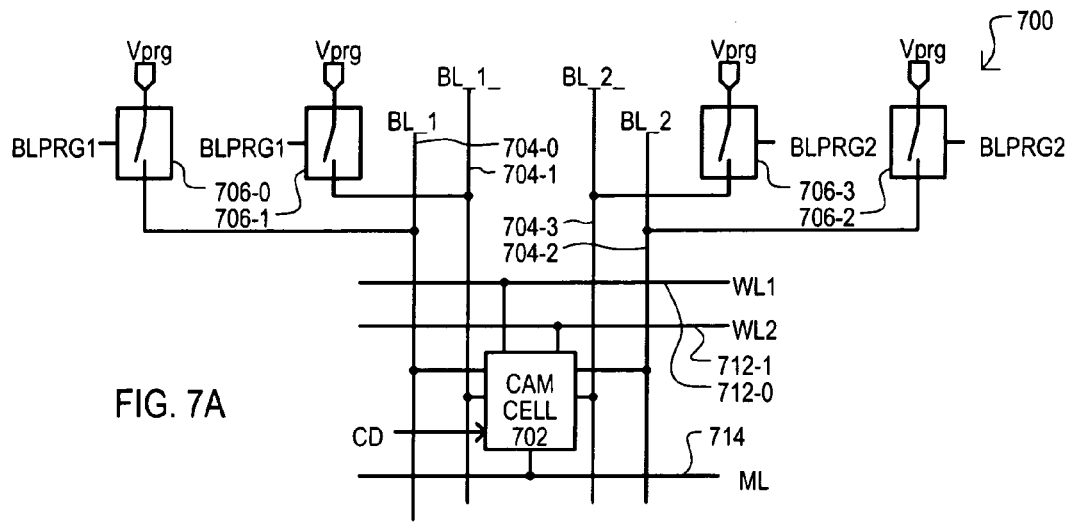
FIG. 7A shows a block schematic diagram of a CAM device according to another embodiment of the invention.

Referring now to FIG. 7A, another CAM device is shown in a block schematic diagram and designated by the general reference character 700. A CAM device 700 can include some of the same general items as FIG. 6, thus like items are referred to by the same reference character but with the first digit being a "7" instead of a "6".

CAM device 700 can differ from that of FIG. 6 in that different bit line pairs 704-0/1 and 704-2/3 can separately access different storage locations within a CAM cell 702. Thus, CAM cell 702 can include a first word line 712-0, that when activated, can connect bit line pair 704-0/1 to one storage location within CAM cell 702. At the same time, a second word line 712-1, that when activated, can connect bit line pair 704-2/3 to another storage location within CAM cell 702.

In such an arrangement, the isolation of different bit line pairs can be separately controlled. In FIG. 7A, bit lines 704-0 and 704-1 can be isolated from, or connected to, a precharge voltage Vprg by a first bit line isolation circuits 706-0 and 706-1, respectively, which can be controlled by first precharge signal BLPRG1. Bit lines 704-2 and 704-3 can be isolated from, or connected to, a precharge voltage Vprg by a second bit line isolation circuits 706-0 and 706-1, which can be controlled by a second precharge signal BLPRG2.

Figure 7B:
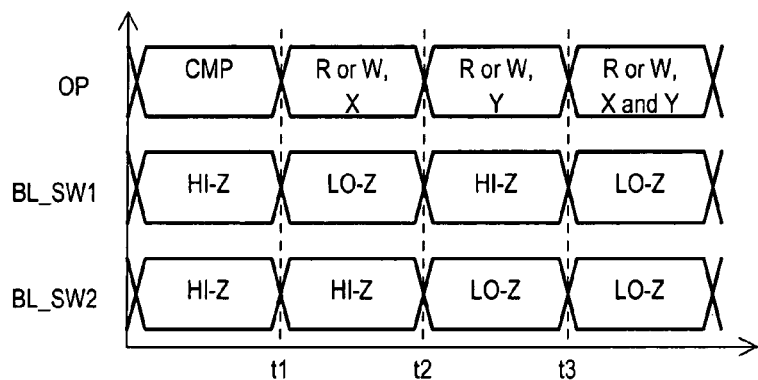
FIG. 7B shows an example of the operation of the device shown in FIG. 7A.

FIG. 7B shows various possible operations for a CAM device like that of FIG. 7A. FIG. 7B includes waveforms OP, BL_SW1, BL_SW2. Waveform OP can represent operations executed by a CAM device. Such operations can include accesses to first storage locations (R or W, X), second storage locations (R or W, X), or both storage locations (R or W, X and Y). Waveform BL_SW1 shows states of impedance paths for first bit line isolation circuits 706-0/1, while waveform BL_SW2 shows states of impedance paths for second bit line isolation circuits 706-2/3.

Prior to time t1, a non-access operation (e.g., compare) is taking place. During this time, bit line isolation circuits 706-0 to 706-3 can be in high impedance (Hi-Z) states, and thus limit the amount of leakage current drawn by all bit lines.

At about time t1, an access operation to first storage locations can take place. At this time, first bit line isolation circuits 706-0/1 can switch from high impedance states (HI-Z) to low impedance states (LO-Z), thus connecting corresponding bit lines 704-0/1 to precharge voltage Vprg. This can place bit lines 704-0/1 at a value best suited for the access operation. However, at the same time, second bit line isolation circuits 706-2/3 can remain in a high impedance state (HI-Z), and thus continue to limit leakage current for these bit lines.

At about time t2, an access operation to second storage locations can take place. At this time, second bit line isolation circuits 706-0/1 can switch from high impedance states (HI-Z) to low impedance states (LO-Z), while first bit line isolation circuits 706-2/3 can remain in a high impedance state (HI-Z).

At about time t3, an access operation to both first and second storage locations can take place. At this time, both first and second bit line isolation circuits 706-0 to 706-3/4 can switch from high impedance states (HI-Z) to low impedance states (LO-Z).

It is noted that switch timing shown in FIG. 7B can be subject to the same variations described above in FIGS. 2B and 2C (e.g., can lead an access operation).

In this way, bit lines for separately providing multiple values to a CAM cell can be separately switched from high impedance states to low impedance states prior to, or at the start of an access operation.

Having described various CAM devices having bit line isolation circuits, various examples of possible bit line isolation circuits will now be described.

Figures 8A, 8B, 8C:
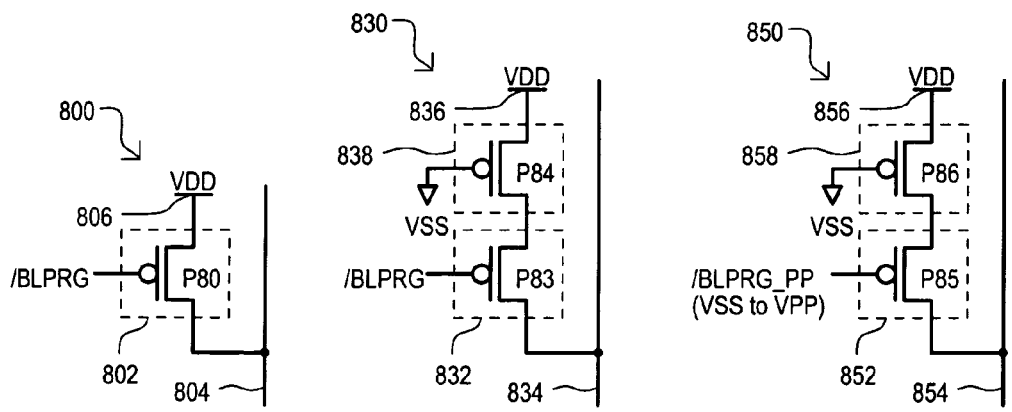
FIGS. 8A to 8C are schematic diagrams showing examples of bit line isolation circuits that can be included in embodiments of the invention.

Referring now to FIG. 8A, a bit line isolation circuit according to a first embodiment is shown in a schematic diagram and designated by the general reference character 800. A bit line isolation circuit 800 can include isolation circuit 802 connected between a bit line 804 and a precharge node 806, which in this case can be at a high power supply voltage VDD. Isolation circuit 802 can include a p-channel insulated gate field effect transistor (IGFET) P80 having a source-drain path connected between precharge node 806 can bit line 804. Transistor P80 can receive a control signal /BLPRG at its gate, that is active when low (e.g., driven to a low logic level, low power supply level, or below the threshold voltage of transistor P80).

In operation, in response to a non-access operation (i.e., one that does not access a storage location within a CAM cell), signal /BLPRG can be at an inactive level (e.g., VDD), which can place transistor P80 into a high impedance state. As a result, bit line 804 can be electrically isolated from precharge node 806, and thus draw essentially no current. This is in contrast to a conventional case that may include an "always on" device to maintain a bit line at a given precharge voltage. In response to an access operation, a signal /BLPRG can transition to an active level, causing transistor P80 to provide a low impedance path, which results in bit line 804 being driven toward the precharge potential, which in this example is VDD.

In this way, an isolation circuit can electrically isolate a bit line from a precharge voltage, and then connect the bit line to the precharge voltage in response to an access operation.

Referring now to FIG. 8B, a bit line isolation circuit according to another embodiment is shown in a schematic diagram, and designated by the general reference character 830. Circuit 830 can include the same general sections as FIG. 8A, thus like sections are referred to by the same reference character, but with the first two digits being "83" instead of "80".

FIG. 8B can differ from that of FIG. 8A in that it can include a static device 838 that is "always on", but arranged in series with isolation circuit 832. In the particular example of FIG. 8B, static device 838 can include a p-channel IGFET P84 having a source connected to precharge node 836 and a drain connected to the source of isolation device P83. A gate of transistor P83 can be connected to a low power supply voltage node (VSS).

An arrangement like that of FIG. 8B can be readily implemented into existing static bit line configurations, by adding isolation device P83 to pre-existing leaker type devices.

Referring now to FIG. 8C, a bit line isolation circuit according to another embodiment is shown in a schematic diagram, and designated by the general reference character 850. Circuit 850 can include the same general sections as FIG. 8B, thus like sections are referred to by the same reference character, but with the first two digits being "85" instead of "83".

FIG. 8C can differ from that of FIG. 8B in that isolation device 852 can be a p-channel IGFET that receives a "boosted" control signal /BLPRG_PP. A signal /BLPRG_PP can have an inactive level that is outside the range of standard signal levels. This can allow isolation device 852 to be placed into a very low current state. In the particular example of FIG.

8C, a typical signal voltage can be from VDD to VSS. However, signal /BLPRG_PP can swing between VPP and VSS, where VPP>VDD. Thus, when signal /BLPRG_PP is inactive (at VPP), a gate-to-source voltage can be not only greater than a threshold voltage (−Vtp), but positive for a p-channel device. In effect, transistor P85 can be turned off "harder" than transistor P86, providing greater reductions in current leakage.

In this way, an isolation circuit can electrically isolate a bit line from a precharge voltage, and then connect the bit line to the precharge voltage in response to an access operation.

It is understood that while the embodiments above show bit line isolation for single bit lines, such arrangements can be used in CAM arrangements having bit line pairs, like those described above. In such arrangements, bit line isolation circuits can be provided for each bit line of a bit line pair, and can be commonly activated/deactivated by a same control signal (e.g., /BLPRG, /BLPRG_VPP).

While the above arrangements have shown bit line isolation from a precharge voltage on an individual basis, other embodiments can include isolation on a group basis. One such arrangement is shown in FIG. 9.

Figure 9:
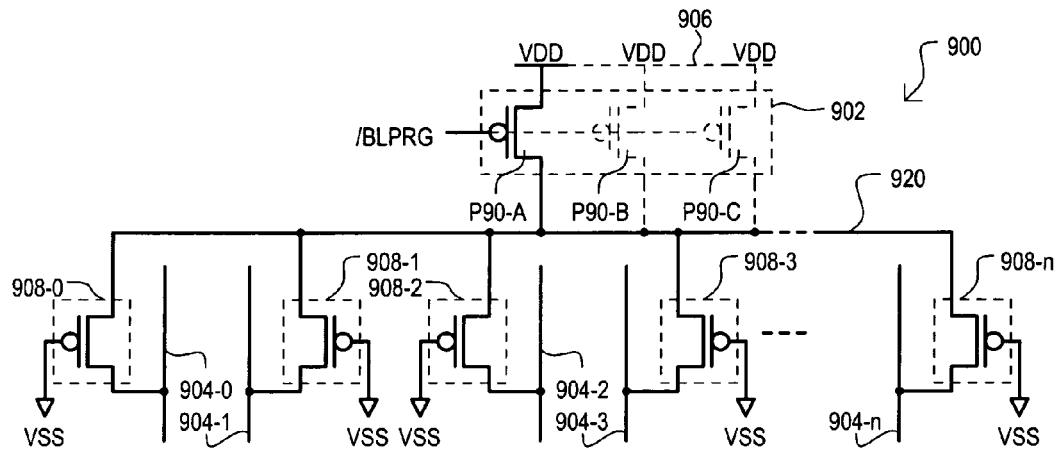
FIG. 9 is a schematic diagram of a bit line isolation circuit according to another embodiment of the invention.

Referring now to FIG. 9, a bit line isolation circuit according to another embodiment is shown in a schematic diagram and designated by the general reference character 900. Circuit 900 can include groups of bit lines commonly isolated from a precharge voltage by a single device, which can be scaled to supply varying amounts of current. The particular example of FIG. 9 can include a group isolation circuit 902 and a number of static devices 908-0 to 908-n. Each static device 908-0 to 908-n can provide a current path to a corresponding bit line 904-0 to 904-n, respectively.

Group isolation circuit 902 can isolate a group of bit lines 904-0 to 904-n from a precharge node 906. That is, group isolation device 902 can isolate static device 908-0 to 908-n from, or connect such devices to, a precharge potential (in this case, a power supply voltage VDD).

In the very particular example of FIG. 9, group isolation circuit 902 can include one or more group isolation p-channel IGFETs (P90-A to P90-C) having source-drain paths connected between precharge node 906 and a common isolation node 920. Gates of group isolation transistors (P90-A to P90-C) can be commonly controlled by a signal /BLPRG. Signal /BLPRG can be subject to the same variations and generated in any of the same ways as signals /BLPRG and /BLPRG_PP described above for FIGS. 8A to 8C.

It is understood that devices P90-B and P90-C can be optional devices, enabled or disabled, as needed for a given performance criteria. For example, if faster precharge speeds are desired, more such devices can be enabled. Enabling or disabling of additional isolation devices can be according to various known techniques, including but not limited to a metal option (including/excluding a conductive line in a fabrication step) and/or programmable logic. Programmable logic approaches can allow or not allow a control signal to be applied to a gate of an isolation device based on volatile storage elements (e.g., latches) or nonvolatile storage elements (e.g., fusible links, antifuse links, nonvolatile memory cells), to name but a few examples.

Referring still to FIG. 9, in the example shown, each static device 908-0 to 908-n can be a p-channel IGFET having a source-drain path connected between common isolation node 920 and a corresponding bit line 904-0 to 904-n. Gates of static devices (908-0 to 908-n) can be connected to a voltage that places them in the "always on" state, which in this case can be a low power supply voltage VSS.

In this way, an isolation circuit can electrically isolate groups of bit lines from a precharge voltage, and then connect such bit lines to the precharge voltage in response to an access operation.

While embodiments of the invention can include particular bit line isolation structures, other embodiments can include CAM device architectures. Two such examples are shown below in FIGS. 10 to 12.

Figure 10:
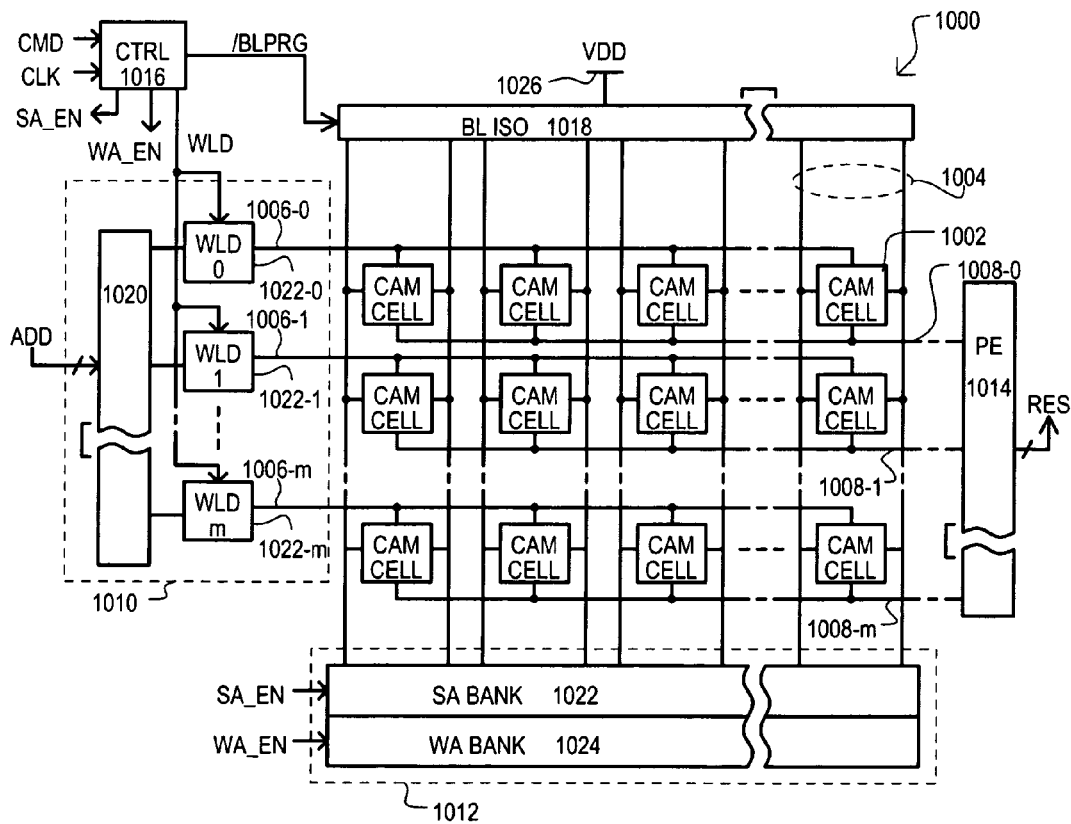
FIG. 10 is a block schematic diagram of a CAM device according to an embodiment of the invention.

Referring now to FIG. 10, a CAM device according to one embodiment is shown in a block schematic diagram and designated by the general reference character 1000. A CAM device 1000 can include a number of CAM cells (one shown as 1002) arranged into an array, with CAM cells of the same column being commonly connected to one or more bit lines (in this example, a bit line pair, one of which is shown as 1004), and CAM cells of the same row being commonly connected to a word line 1006-0 to 1006-m and a match line 1008-0 to 1008-m.

Referring still to FIG. 10, a CAM device 1000 can also include a row driving section 1010, column control section 1012, prioritizing section 1014, control circuits 1016, and bit line isolation circuits 1018.

Row driving section 1010 can control activation and deactivation of word lines (1006-0 to 1006-m). Each word line (1006-0 to 1006-m) can control access to storage locations within CAM cells of its corresponding row. In the example shown, row driving section 1010 can include a row decoder 1020 and a word line driver 1022-0 to 1022-m corresponding to each word line 1006-0 to 1006-m, respectively. Each word line driver (1022-0 to 1022-m) can drive its corresponding word line (1006-0 to 1006-m) between active and inactive levels based upon select signals received from row decoder 1020 and one or more activation signals (WLD) received from control circuits 1016. In the very particular example shown, word line driver circuits (1022-0 to 1022-m) can each receive a word line drive signal WLD from control circuits 1016.

A column control section 1012 can include circuits for receiving read data from, or applying write data to columns of CAM cells. In the very particular example shown, column control section 1012 includes a sense amplifier bank 1022 and a write amplifier bank 1024. Sense amplifier bank 1022 can includes sense amplifiers for amplifying read data on bit lines connected to CAM cells. In the example shown, sense amplifier bank 1022 can be controlled by a sense amplifier enable signal SA_EN.

A write amplifier bank 1024 can include write amplifiers for driving bit lines in response to received write data. In the example shown, write amplifier bank 1024 can be controlled by a write amplifier enable signal WA_EN.

It is noted that a CAM device can optionally include column selection circuitry between bit lines and column control section 1012. Further, in some embodiments a sense amplifier bank can be the same as a write amplifier bank. That is, one bank of amplifiers can serve to both sense read data from bit lines and to drive write data onto bit line.

A prioritizing section 1014 can receive match indications from match lines 1008-0 to 1008-m, and in response thereto, generate a compare result value RES. In one very particular arrangement, a prioritizing section 1014 can include a priority encoder that can prioritize match indications on match lines (1008-0 to 1008-m) to generate a result value RES.

A bit line isolation circuit 1018 can be connected between bit lines of CAM device 1000 and a precharge voltage node 1026. In the particular example shown, a precharge voltage Vprg can be a high power supply voltage VDD. Bit line isolation circuit 1018 can isolate bit lines from, and connect bit lines to precharge voltage node 1026 according to any of the arrangements shown in the embodiments disclosed herein, and equivalents. Bit line isolation circuit 1018 can operate in response to a control signal /BLPRG.

Control circuits 1016 can receive command data (CMD) and one or more timing signal (CLK), and in response thereto, generate control signals for the various sections of CAM device 1000, including but not limited to /BLPRG, WLD, SA_EN and/or WA_EN, described above.

Having described a CAM device according to one embodiment in FIG. 10, the operation of such a device will now be described with reference to FIG. 11.

Figure 11:
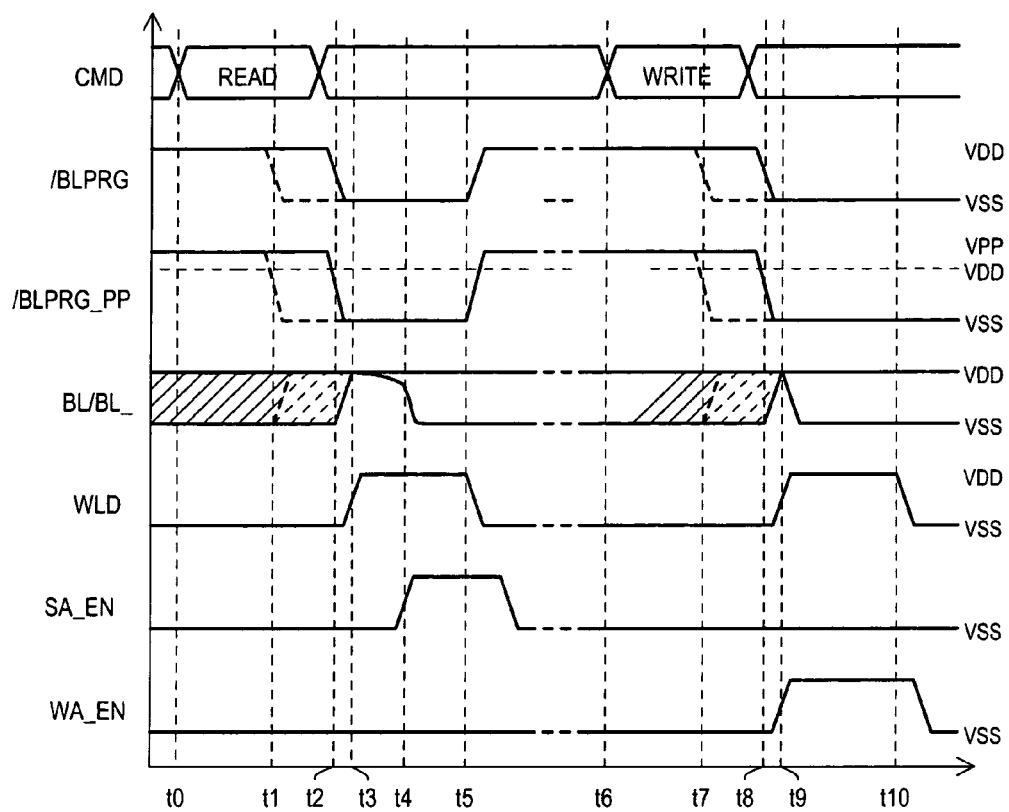
FIG. 11 is a timing diagram showing an example operation of the CAM device of FIG. 10.

FIG. 11 shows a timing diagram illustrating bit line isolation operations in a CAM device like that of FIG. 10. FIG. 11 shows a waveform CMD which can indicate received command data that can indicate a type of operation to be executed by the CAM device, signal /BLPRG which can control operations of a bit line isolation circuit, signal /BLPRG_PP which can be an alternate control signal for a bit line isolation circuit, a waveform BL/BL_ which can illustrate the response to a bit line pair, signal WLD which can control word line driver circuits, signal SA_EN which can control a sense amplifier bank, and signal WA_EN which can control a write amplifier bank.

Referring now to FIG. 11 in conjunction with FIG. 10, prior to time t0, a bit line isolation signal /BLPRG can be inactive (at VDD in this example). As a result, a bit line isolation circuit 1018 can isolate bit lines (e.g., 1004) from a precharge voltage VDD, and thus reduce leakage current over conventional cases that may include "always on" static devices connected to bit lines. In arrangements having a "boosted" bit line isolation signal /BLRPG_PP, such a signal can be at a boosted level (at VPP in this example), thus placing isolation devices within bit line isolation circuit 1018 into very high impedance states, assuming such devices are p-channel IGFETs.

At about time t0, command data CMD can indicate an access is to take place, in this case a read operation. To ensure read operations are properly executed, it is desirable to place bit lines at the precharge voltage VDD. FIG. 11 shows two possible operations in response to such an access. A first type operation precharges bit lines substantially prior to an access operation (at about time t1), while a second approach precharges bit lines at the same essential time as an access operation (at about time t2).

At about time t1, in a first type approach, in response to the read command data CMD, a bit line isolation signal (/BLPRG or /BLPRG_PP) can transition from an inactive state (e.g., VDD or VPP) to an active state (e.g., VSS), which is shown by dashed lines in FIG. 11. As a result, bit lines BL/BL_ can be precharged to about VDD (also shown by dashed lines). In this way, bit lines can be released from isolation prior to an access operation, and precharged to a desired level.

Alternatively, signals /BLPRG or /BLPRG_PP can transition from the inactive to active state at a about time t2, resulting in bit lines BL/BL_ being precharged to VDD at that time. Such a response is shown by solid lines.

After bit lines are no longer isolated from a precharge potential, and are precharged to a desired level, a read operation can take place.

At about time t3, a word line driver signal WLD can transition from an inactive level (e.g., VSS) to an active level (e.g., VDD). As a result, a word line (selected according to a decoded address) can be driven to an active level, connecting storage circuits within CAM cells of the row to corresponding bit lines. Such an action can cause bit line levels to change in response to data values stored in the selected row of CAM cells. FIG. 11 shows this operation, by waveform BL/BL_ splitting (developing a differential voltage across a bit line pair).

At about time t4, signal SA_EN can transition from an inactive level (e.g., VSS) to an active level (e.g., VDD), thus enabling sense amplifiers connected to the bit lines. As a result, a differential voltage across bit line pairs can be amplified, resulting in one bit line being driven low.

At about time t5, a bit line isolation signal (/BLPRG or /BLPRG_PP) can transition back to the inactive state (VDD or VPP), once again isolating bit lines from a precharge voltage VDD.

In this way, bit lines can be initially isolated from a precharge voltage. Then, in response to a read operation, such bit lines can be connected to the precharge voltage.

At about time t6, command data CMD can indicate another access is to take place, in this case a write operation. As in the case of the read operation, to ensure write operations are executed properly, it is desirable to place bit lines at the precharge voltage VDD.

A write operation can occur in the same general fashion, and include the same general variations in timing as a read operation. Thus, signals at times t6 to t10 can generally follow those at times t0 to t5, respectively. However, in the write operation case, signal WA_EN can be activated prior to or coincident with the activation of signal WLD.

In this way, bit lines can be initially isolated from a precharge voltage. Then, in response to a write operation, such bit lines can be connected to the precharge voltage.

It is noted that FIG. 10 shows a CAM device 1000 having match lines with common connections to a row of CAM cells. Such an arrangement is often referred to as a "NOR" or "OR" type CAM device architecture. However, alternate embodiments can include different types of architectures. One such arrangement is shown in FIG. 12.

Figure 12:
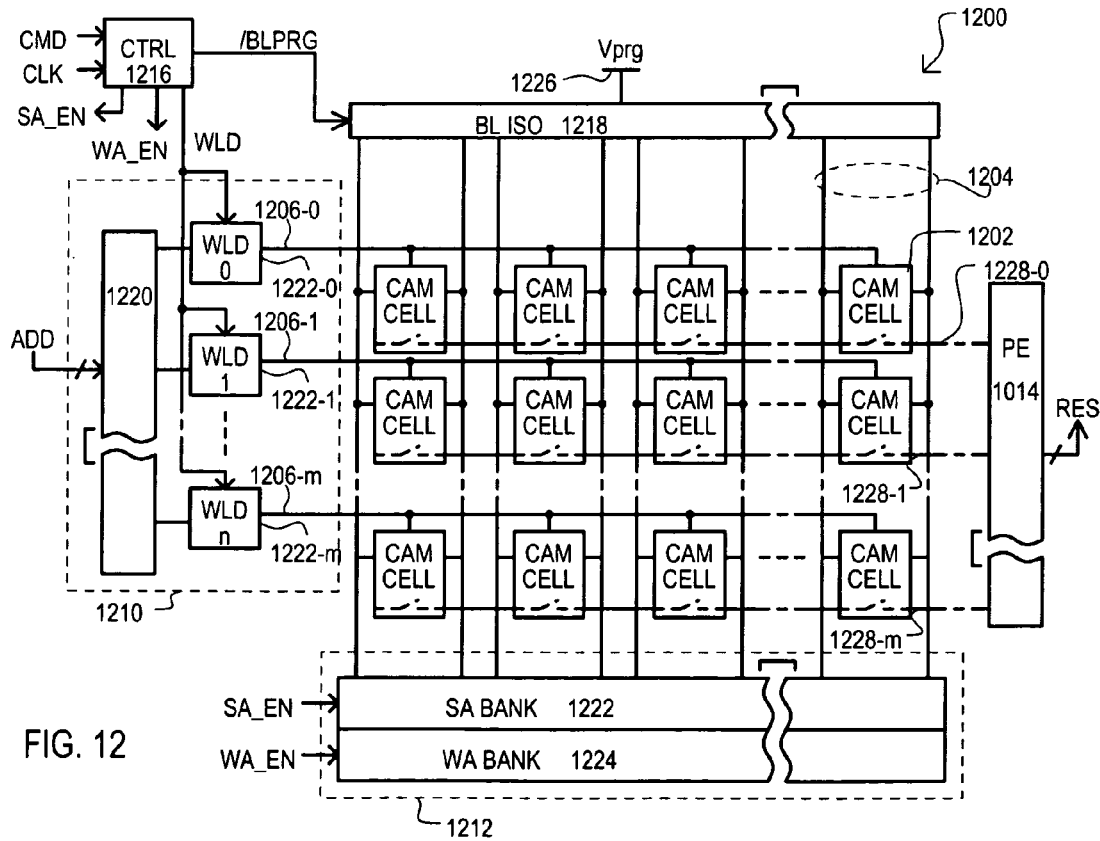
FIG. 12 is a block schematic diagram of a CAM device according to another embodiment of the invention.

FIG. 12 shows a CAM device according to an alternate embodiment that is designated by the general reference character 1200. A CAM device 1200 can include some of the same sections as CAM device 1000 of FIG. 10. Accordingly, like sections are referred to by the same reference character but with the first digits being "12" instead of "10". CAM device 1200 can also operate in the same general fashion as shown in FIG. 11.

A CAM device 1200 can differ from the arrangement of FIG. 10 in that it can include NAND/AND type match lines 1228-0 to 1228-*m*. Such match lines (1228-0 to 1228-*m*) can include line segments that pass through, and are enabled by CAM cells of a corresponding row.

In this way, bit line isolation approaches according to the disclosed embodiments can be utilized in various CAM device architectures to reduce current consumption.

While various embodiments above have shown arrangements in which CAM device bit lines can be isolated from a precharge voltage that is a power supply voltage, alternate embodiments can isolate bit lines from a precharge voltage having an intermediate level between a high power supply voltage and a low power supply voltage. Particular examples of such approaches will now be described with reference to FIGS. 13 to 15.

Referring now to FIG. 13, a CAM device according to an embodiment is shown in a block schematic diagram and designated by the general reference character 1300. A CAM device 1300 can include CAM cells (one shown as 1302) connected to bit line pairs 1304-0 and 1304-1. A bit line isolation/equalization (iso/eq) circuit 1306 can be connected between bit line pairs 1304-0/1.

A CAM cell 1302 can include storage circuits and compare circuits. Compare circuits can compare values stored in such storage circuits to received compare data values CD, and in response, generate a match indication on match line 1308. Either or both of bit lines of pair 1304-0/1 can be connected to storage circuits within a CAM cell 1302 in response to activation of a word line 1310.

A bit line iso/eq circuit 1306 can be placed into an isolation state or an equalization state in response to a bit line isolation signal BLPRGe. In an isolation state, bit line iso/eq circuit 1306 can isolate bit lines 1304-0/1 from a precharge node 1312 and from one another. A precharge node 1312 can be at an equalization voltage Vprg. However, unlike other embodiments described above, an equalization voltage can be between a high power supply voltage VDD and a low power supply voltage VSS, and preferably about midway between the two. In an equalization state, a bit line iso/eq circuit 1306 can connect both bit lines 1304-0/1 to precharge node 1312, as well as to one another. Such an action can equalize a potential of bit lines 1304-0/1, which can be a preferred state for some read or writing circuits.

In an arrangement like that of FIG. 13, an access operation can be read operation, write operation, or a refresh operation, in the event a CAM cell 1302 includes dynamic storage circuits.

In this way, in response to an access operation, a bit line isolation circuit can switch from isolating a bit line pairs from a precharge voltage to connecting such bit lines to the precharge voltage and to one another.

Referring now to FIG. 14, one example of a bit line iso/eq circuits that can be included in an embodiment like that of FIG. 13 is shown a schematic diagram and designated by the general reference character 1400. A bit line iso/equ circuit 1400 can include a first isolation device N140, a second isolation device N142, and an equalization device N144. A first isolation device N140 can provide a controllable current path between a precharge node 1406 and a first bit line 1404-0. Similarly, a second isolation device N142 can provide a controllable current path between precharge node 1406 and a second bit line 1404-1. Unlike arrangements noted above, bit line iso/eq circuit 1400 can further include equalization device N144 that can provide a controllable current path between first bit line 1404-0 and second bit line 1404-1. In the very particular example of FIG. 14, isolation and equalization devices N140, N142, N144 can be n-channel IGFETs.

Referring still to FIG. 14, when a bit line isolation signal BLPRGe is inactive (low in this example), isolation devices N140 and N142 can be in a high impedance state. As result, bit lines 1404-0/1 can be isolated from precharge node 1406. In addition, isolation device N144 can also be in a high impedance state resulting in bit lines 1404-0/1 being isolated from one another.

However, when bit line isolation signal BLPRGe is active (high in this example), isolation devices N140 and N142 can provide low impedance paths between precharge node 1406 and first and second bit lines 1404-0 and 1404-1. In addition, equalization device N144 can provide a low impedance path between bit lines 1404-0 and 1404-1.

FIG. 14 shows an arrangement in which isolation devices N140/2 and equalization device N144 can be n-channel IGFETs. In such an arrangement, a bit line isolation signal BLPRGe can vary between a high power supply voltage VDD and a low power supply voltage VSS. However, in alternate embodiments, such a signal can be a "boosted" control signal BLPRGe_BB. A signal BLPRGe_BB can have an inactive level that is outside the range of standard signal levels. This can allow isolation devices and equalization device to be placed into a very low current state. In one particular arrangement, a typical logic signal voltage for a CAM device can be from VDD to VSS. In contrast, a signal BLPRGe_BB can swing between VDD and VBB, where VBB<VSS. Thus, when signal BLPRGe_BB is inactive (at VBB), a gate-to-source voltage can be not only less than a threshold voltage (Vtn), but negative for such n-channel devices. That is, like the arrangement of FIG. 8C, transistors N140, N142 and/or N144 can be turned off "harder" than would be the case with standard logic signal voltages.

Of course, while FIG. 14 shows an arrangement that includes n-channel IGFETs, alternate embodiments could utilize p-channel devices with appropriate switching of signal levels.

Referring now to FIG. 15, a timing diagram shows bit line isolation operations in a CAM device like that of FIGS. 13 and/or 14. FIG. 15 includes many of the same waveforms as FIG. 11. Like waveforms are referred to by the same reference character.

FIG. 15 can differ from FIG. 11 in that it shows bit line isolation signals BLPRGe and BLPRGe_BB, and bit lines BL/BL_ can be equalized to voltage Veq between power supply levels (VDD and VSS), as opposed to being precharged to a power supply level.

Referring now to FIG. 15 in conjunction with FIG. 13, prior to time t0, a bit line isolation signal BLPRGe can be inactive (at VSS in this example). As a result, bit lines can isolate bit lines from a precharge voltage Vprg and from one another, thus reducing leakage current over conventional cases that may include "always on" static devices connected to bit lines. In arrangements having a "boosted" bit line isolation signal BLRPGe_BB, such a signal can be at a boosted level (at VBB in this example), thus placing isolation devices and equalization devices into very high impedance states.

At about time t0, command data CMD can indicate an access is to take place, in this case a read operation. In the example of FIG. 15, to ensure read operations are accurate it is desirable to place bit lines at intermediate voltage Veq.

At about time t1, in response to the read command data CMD, a bit line isolation signal (BLPRGe or BLPRGe_BB) can transition from an inactive state (e.g., VSS or VBB) to an active state (e.g., VDD). As a result, bit lines BL/BL_ can be precharged and equalized to a voltage Veq. In this way, bit lines can be released from isolation prior to an access operation, and then equalized in response to the access operation. After sufficient time has passed, a bit line isolation signals (BLPRGe or BLPRGe_BB) can transition back to the inactive state once again isolating bit lines from precharge voltage Vprg.

After bit lines are once again isolated from a precharge voltage, at about time t2, a word line driver signal WLD can transition from an inactive level (e.g., VSS) to an active level (e.g., VDD). As a result, a word line (determined by an address decoder) can be driven to an active level, connecting storage circuits for CAM cells of a row to corresponding bit line pairs. Such an action can cause bit line levels to change in response to data values stored in the selected row of CAM cells. FIG. 11 shows this operation, by waveform BL/BL_ splitting (developing a differential voltage across a bit line pair).

At about time t3, signal SA_EN can transition from an inactive level (e.g., VSS) to an active level (e.g., VDD), thus enabling sense amplifiers connected to the bit lines. As a result, a differential voltage across bit line pairs can be amplified, resulting in bit lines being driven to complementary values.

In this way, bit lines can be initially isolated from a precharge voltage. Then, in response to a read operation, such bit lines can be precharged and equalized.

At about time t4, command data CMD can indicate a write operation is to take place. As in the case of the read operation, to ensure write operations are executed properly, are accurate it is desirable to place bit lines at an intermediate precharge voltage Veq.

A write operation can occur in the same general fashion, and include the same general variations in timing as a read operation. Thus, signals at times t5 to t6 can generally follow those at times t0 to t2, respectively. However, in the write operation case, signal WA_EN can be activated prior to or coincident with the activation of signal WLD.

In this way, bit lines can be initially isolated from a precharge voltage. Then, in response to a write operation, such bit lines can be connected to the precharge voltage and equalized.

In various embodiments above, a bit line isolation signal (e.g., /BLPRG, /BLPRG_PP, BLPRGe, BLPRGe_BB) can transition between levels in response to an access operation. Examples showing possible ways of generating such signals will now be described with reference to FIGS. 16A to 17B.

Referring now to FIG. 16A, a timing diagram shows one of many possible ways in which a bit line isolation signal can be generated. FIG. 16A shows a number of waveforms including CLK_I, which can be a clock signal that is synchronous with an externally received clock signal and internal to a CAM device, a waveform R/W_OP that can be activated (transition from low to high) in response to a read or write operation, a waveform /BLPRG which can control the isolation of bit lines from a precharge voltage, and a waveform R/W_EX which indicates when a read or write operation is being executed within a CAM device.

FIG. 16A shows an arrangement in which a bit line isolation signal /BLPRG can be controlled in a manner synchronous with an internal clock CLK_I.

At about time t0, a read or write operation can be indicated by R/W_OP transitioning high. A signal R/W_OP can be generated by an instruction decoder, or the like, latching signal R/W_OP on a falling edge of signal CLK_I. At this time, signal /BLPRG can be inactive (high in this example), resulting in bit lines being isolated from a precharge voltage.

At about time t1, in response to signal R/W_OP being high and signal CLK_I transition high, signal /BLPRG can be driven low. This is shown by dashed lines in FIG. 16A. Thus, the dashed portion of waveform /BLPRG shows such a signal can be activated ½ or more clock cycles prior to a read or write operation.

At about time t2, read or write operations can be executed in CAM device. As shown by the solid form of waveform /BLPRG, alternatively, signal /BLPRG may not lead but can be essentially coincident with read or write operations occurring within a CAM device.

At about time t3, signal /BLPRG can return to an inactive level in synchronism with signal CLK_I, once again isolating bit lines from a precharge voltage.

Of course while FIG. 16A shows particular events occurring on sequential half cycles of signal CLK_I, additional half-cycles could be introduced between such events, if desired.

Referring now to FIG. 16B, a circuit for generating a bit line isolation signal /BLPRG like that of FIG. 16A is shown in a block schematic diagram and designated by the general reference character 1600. A circuit 1600 can receive a clock signal CLK_I and operation indication signal R/W_OP, and in response thereto, generate a bit line isolation signal /BL-PRG. As but one example, a circuit 1600 can include simple logic gate that provides an AND/NAND like function.

In this way, a bit line isolation signal can be generated synchronously with an internal clock signal.

Figure 17A:
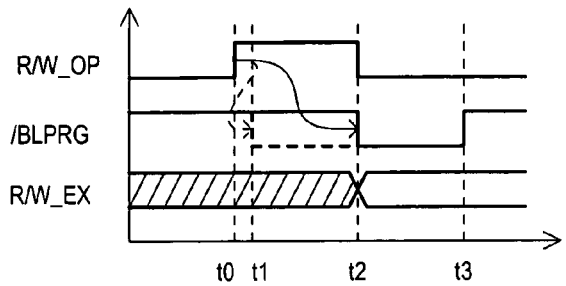
FIG. 17A is a timing diagram showing a CAM device operation according to another embodiment.

Referring now to FIG. 17A, a timing diagram shows another of the many possible ways in which a bit line isolation signal can be generated. FIG. 17A shows the same general waveforms and FIG. 16A, but does not include clock signal CLK_I.

FIG. 17A shows an arrangement in which a bit line isolation signal /BLPRG can be asynchronous, being self-timed with respect to a signal R/W_OP.

At about time t0, a read or write operation can be indicated by R/W_OP transitioning high. As in the case of FIG. 16A, a signal R/W_OP can be generated by an instruction decoder. At this time, signal /BLPRG can be inactive (high in this example), resulting in bit lines being isolated from a precharge voltage.

At about time t1, in response to signal R/W_OP transitioning high, signal /BLPRG can pulse low. This is shown by dashed lines in FIG. 17A. Thus, the dashed portion of waveform /BLPRG shows such signal that is activated well in advance of the corresponding read or write operation.

At about time t2, read or write operations can be executed in CAM device. As shown by the solid form of waveform /BLPRG, alternatively, a delay in the activation of signal /BLPRG can be introduced so that such a signal is activated essentially coincident with the corresponding read or write operation.

At about time t3, signal /BLPRG can return to an inactive level automatically, once again isolating bit lines from a precharge voltage.

Figure 17B:
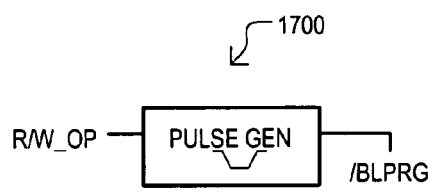
FIG. 17B is a block schematic diagram of a circuit that can be used in an embodiment like that of FIG. 17A.

Referring now to FIG. 17B, a circuit for generating a bit line isolation signal /BLPRG like that of FIG. 17B is shown in a block schematic diagram and designated by the general reference character 1700. A circuit 1700 can be a pulse generator circuit that receives a signal R/W_OP. In response to a predetermined transition in input signal R/W_OP (e.g., high to low), circuit 1700 can generate a pulse (in this example a low going pulse) that can serve as the basis for a bit line isolation signal /BLPRG.

In this way, a bit line isolation signal can be generated asynchronously in response to predetermined access operation indications.

Of course, while FIGS. 16A to 17B show the generation of active low bit line isolation signals, alternate embodiments can include bit line isolation signals that are active when at a logic high.

As noted above, in some embodiments a bit line isolation signal may be have levels outside power supply voltages or normal logic signals levels of a CAM device. Two examples of circuits for generating such boosted bit line isolation signals are shown in block schematic diagrams in FIGS. 18A and 18B.

Figure 18A:
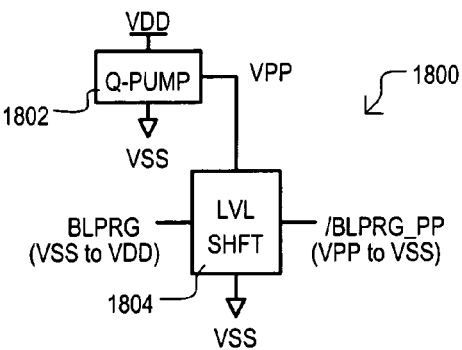
FIGS. 18A and 18B show level shifting circuits that can be used to generate bit line isolation signals in embodiments of the invention.

Referring now to FIG. 18A a signal generating circuit 1800 can include a charge pump circuit 1802 and a level shifting circuit 1804. A charge pump circuit 1802 can operate between a high power supply voltage VDD and a low power supply voltage VSS, and can charge a node to a voltage VPP that is above a high power supply voltage VDD. Such a charging operation can be in response to single event (clock pulse), or a continuous input (oscillating signal). A resulting boosted voltage VPP can be provided as an input to level shifting circuit 1804.

Level shifting circuit 1804 can receive an input signal BLPRG that can vary between supply voltage levels (VSS and VDD), and in response, generate a signal /BLPRG_PP that varies between a high boosted level (VPP) and a low supply level (VSS). While a level shifting circuit 1804 can be inverting, alternate arrangements can be non-inverting.

Figure 18B:
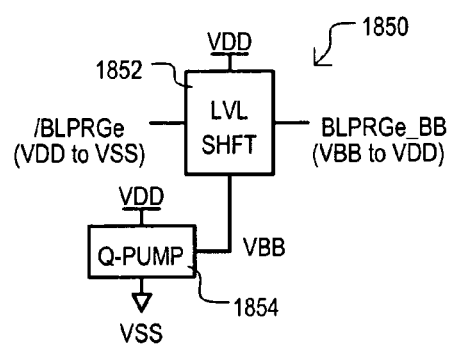

Referring now to FIG. 18B a second type signal generating circuit 1850 can also include a charge pump circuit 1852 and a level shifting circuit 1854. Unlike the arrangement of FIG. 18A, charge pump circuit 1852 can charge a node to a voltage VBB that is below a low power supply voltage VSS. Boosted voltage VBB can be provided as an input to level shifting circuit 1854.

Level shifting circuit 1854 can operate in the same fashion as 1804 of FIG. 18A, but can generate a signal that varies between VBB and VDD.

While embodiments above have shown arrangements in which a single bit line isolation signal can activated/deactivated in response to particular operations, in other embodiments, a CAM device can include multiple such signals, each for different portions of a CAM device. This can enable bit lines in non-accessed portions of a CAM device to remain in a low leakage state, while bit lines in an accessed portion can be connected to a precharge potential. Examples of such an approach will now be described with reference to FIGS. 19 to 21.

Figure 19:
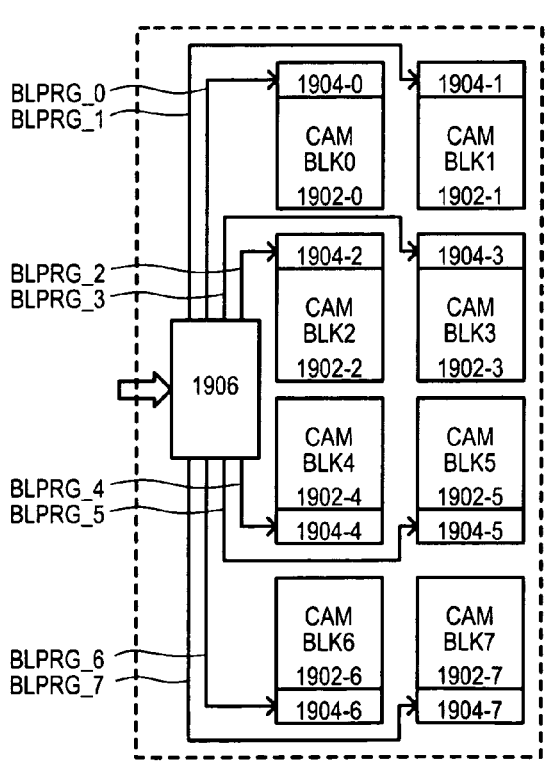
FIG. 19 is a top plan view of a CAM device according to an embodiment of the invention.

Referring now to FIG. 19, a CAM device is shown in a top plan view, and designated by the general reference character 1900. A CAM device 1900 can include a number of different blocks, each having its own set CAM cells, corresponding bit lines, and circuits for executing access operations (e.g., read or write) as well as non-access operations (e.g., compare). Other elements of a CAM device have been excluded from FIG. 19 to avoid unduly cluttering the view.

The particular CAM device 1900 shows an arrangement with eight blocks 1902-0 to 1902-7, but the particular number of blocks should not necessarily be construed as limiting to the invention. Each CAM block (1902-0 to 1902-7) can include bit line isolation circuits 1904-0 to 1904-7 according to any of the above embodiments. Each bit line isolation circuit (1904-0 to 1904-7) can be controlled by a corresponding control signal BLPRG_0 to BLPRG_7.

A control circuit 1906 can activate or deactivate each of control signals BLPRG_0 to BLPRG_7 separately, and according to the type of operation being executed by each CAM block (1902-0 to 1902-7).

In this way, bit lines of different blocks of a CAM device can be selectively placed into a low current state depending upon the operation being executed in the corresponding block.

Figure 20:
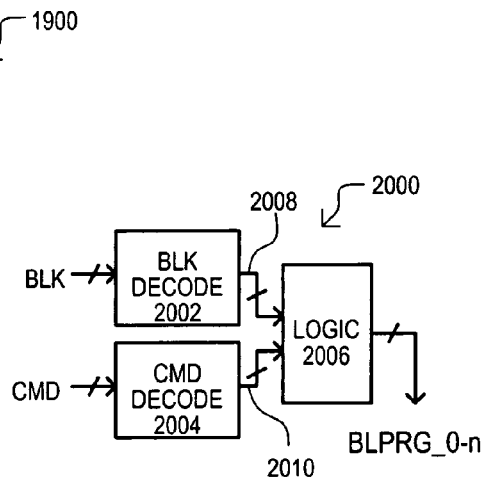
FIG. 20 shows a signal generation circuit that can be included in the embodiment of FIG. 19.

Referring now to FIG. 20, a block signal generator circuit that can be included in a control circuit, like that shown as 1906 of FIG. 19, is shown in a block schematic diagram, and designated by the general reference character 2000. A block signal generator 2000 can include a block decode circuit 2002, a command decode circuit 2004, and a logic 2006. A block decode circuit 2002 can receive a value BLK that can indicate one or more blocks of CAM device, and in response, generate block activation signals 2008.

A command decode circuit 2004 can receive command data CMD, and in response thereto, generate command values 2010.

A logic circuit 2006 can receive block activation signals 2008 and command values 2010 and in response thereto, generate bit line isolation signals BLPRG_0 to BLPRG_n for all n+1 blocks of a CAM device. For example, if a block activation signal indicates a block is being accessed, the corresponding bit line isolation signal can be activated depending upon a corresponding command value. More particularly, if a block select signal is active and the corresponding command value indicates a read or write operation, the bit line isolation signal for the block can be activated and deactivated, allowing the bit lines of the CAM block to be precharged. However, if the command value indicates the operation is not a read or write, the bit line isolation signal can remain inactive, maintaining the bit lines in a low leakage state.

Referring now to FIG. 21, one example of accesses to a multi-bank CAM device is shown in a timing diagram. FIG. 21 shows waveforms specific to each of blocks 0 to n of a CAM device. A waveform BLKi (OPERATION) indicates a type of operation occurring in CAM block i (where i is any of 0 to n). Waveforms BLGPRGi show bit line isolation signals for each CAM block.

At about time t0, compare operations can be executed on CAM blocks 0 to 2, while CAM block n is in an idle state. Because such operations and states do not access storage cells within CAM cells of the blocks, corresponding bit line isolation signals BLPRG_0 to BLPRG_2 and BLPRG_n can be inactive (low in this example).

At about time t1, a read operation can be executed in CAM block 0, while the remaining illustrated CAM blocks can be in an idle state. As a result, bit line isolation signal BLPRG_0 can transition from inactive to active at this time, to precharge bit lines within CAM block 0. However, bit line isolation signals of the remaining bit lines are inactive, maintaining a high impedance between a precharge voltage and the bit lines of these CAM blocks.

At about time t2, compare operations can be executed in CAM blocks 0 and 1, CAM block 2 can be idle, and CAM block n can be subject to a write operation. As a result, bit line isolation signal BLKPRG_n can transition from inactive to active at this time, to precharge bit lines within CAM block n. Remaining bit line isolation signals can be inactive.

In this way, bit lines of different CAM blocks can be selectively isolated from precharge voltages according to the type of operations occurring in such blocks.

Having described various bit line isolation structures and methods for CAM devices, particular examples of CAM cell structures for inclusion with such bit line isolation approaches will now be described.

Referring now to FIG. 22, one example of a CAM cell that can be included in CAM devices of the embodiments is shown in a block schematic diagram and designated by the general reference character 2200. A CAM cell 2200 can include a storage circuit 2202 and a compare circuit 2204. A storage circuit 2202 can provide stored data DATA to compare circuit 2204. According to received stored data values DATA and compare data values CD, compare circuit 2204 can generate a match indication on a match line 2206. Such a compare indication can include, without limitation, any of: connecting a match line 2206 to a predetermined potential, creating a high impedance path between the match line 2206 and a predetermined potential, creating a low impedance path in match line 2206, and/or creating a high impedance path in match line 2206.

In a binary CAM cell arrangement, a storage circuit 2202 can provide a single data value to a compare circuit 2204, preferably in complementary format (D and /D). In a ternary CAM cell arrangement, a storage circuit 2202 can provide two or more data values to a compare circuit 2204.

Referring still to FIG. 22, in a single ended arrangement, a storage circuit 2202 can be accessed by enabling an access device 2208-0 to provide a data path between a first bit line 2210-0 and storage circuit 2202. Additionally, in a differential arrangement, storage circuit 2202 can be further accessed by enabling a second access device 2208-1 to provide a complementary data path between a second bit line 2210-1 and storage circuit 2202. Access device 2208-0 (or devices 2208-0/1) can controlled via word line 2212.

Using access devices (2208-0 and 2208-1) formed by n-channel insulated gate field effect transistors can provide advantageously fast and compact access paths. However, other embodiments can include different types of access devices.

While a storage circuit 2202 like that of FIG. 22 can include nonvolatile circuit storage circuits, preferably a storage circuit 2202 includes volatile storage circuits. Two of many possible types of storage circuits that can be included in the embodiments are shown in FIGS. 23 and 24.

FIG. 23 shows a storage circuit 2300 that having a static RAM type configuration, including storage element 2302, connected to bit line 2310-0 by access device 2308-0, and optionally to bit line 2310-1 by access device 2308-1. A storage element 2302 can be a latch circuit, formed by cross coupled inverters INV0 and INV1, that can provide complementary data values D and /D to a compare circuit (not shown). Access device(s) 2308-0(/1) can be controlled by a word line 2312.

FIG. 24 shows a storage circuit 2400 that having a dynamic RAM type configuration, including storage element 2402, connected to bit line 2410-0 by access device 2408-0, and optionally to bit line 2410-1 by access device 2408-1. A storage element 2402 can include a storage capacitor C1, and optionally, a storage capacitor C2. Storage element 2402 can provide one or more data values to a compare circuit (not shown). Like the arrangement of FIG. 23, access device(s) 2408-0(/1) can be controlled by a word line 2412.

While groups of bit lines can be isolated and then connected to a precharge voltage essentially simultaneously, alternate arrangements can connect groups of isolation devices that switch between high and low impedance states in a sequential (i.e., rippling) fashion. Such an arrangement can reduce peak current involved in a bit line precharge operation. One very particular example of such an approach is shown in FIGS. 25A to 25C.

Referring now to FIG. 25A a bit line isolation circuit according to another embodiment is shown in a block schematic diagram and designated by the general reference character 2500. A bit line isolation circuit 2500 can include groups of bit lines 2502-A to 2502-C each connected to a precharge voltage in response to different bit line isolation signals BLPRG_A to BLPRG_C, respectively. Thus, bit lines of group 2502-A can be connected to a precharge node 2504 by bit line isolation circuits 2506-A, bit lines of group 2502-B can be connected to precharge node 2504 by bit line isolation circuits 2506-B, and bit lines of group 2502-C can be connected to a precharge node 2504 by bit line isolation circuits 2506-C.

Referring now to FIG. 25B, a timing diagram shows the activation of bit line isolation signals of FIG. 25A. As shown, prior to time t0, bit line isolation signals BLPRG_A to BLPRG_C can all be inactive (low in this example), placing bit line isolation circuits 2506-A to C in high impedance states.

At about time t0, a first of the bit line isolation signals BLPRG_A can be activated, resulting in bit line group 2506-A being precharged to a precharge voltage Vprg. However, the other bit line isolation signals BLPRG_B and BLPRG_C can remain inactive, maintaining bit lines of groups 2506-B/C in the low leakage state.

In a sequential fashion the remaining bit line isolation signals BLPRG_B and BLPRG_C can be activated until all bit lines have been precharged (shown at about times t1 and t2).

Once all bit lines have been precharged, a word line corresponding the row can be activated (go high in this example), allowing CAM cells of the row to be accessed for a read or write operation.

It is noted that bit line isolation signals BLPRG_A to BLPRG_C can return to an inactive state sequentially, or simultaneously. Further, a previously activated bit line isolation signal could return to an inactive state prior to the activation of a subsequent bit line isolation signal.

Referring now to FIG. 25C, one very particular example of a sequential bit line isolation signal generating circuit is shown in a block schematic diagram, and designated by the general reference character 2550. A circuit 2550 can include a series connection of delay buffers 2552-0 to 2552-2, each of which can output a different bit line isolation signal BLPRG_A to BLPRG_C.

In this way, a CAM device can include groups of bit lines isolation circuits that can be can switched from a high impedance state to a low impedance state in a sequential fashion.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
  a plurality of bit lines, at least one bit line being coupled to storage circuits of CAM cells in a corresponding column, each CAM cell including compare circuits that compare a stored value to at least one comparand value;
  at least one isolation circuit having a controllable impedance path between at least one of the bit lines and a precharge voltage node and controlled by application of a potential at a control node; and
  a control circuit coupled to the control node configured to switch the at least one isolation circuit from a high impedance state to a low impedance state in response to, and no later than the start of, an access operation that couples one of the CAM cells of a column to the corresponding bit line, the control circuit configured to maintain the low impedance state for a duration of at least a portion of the access operation.

2. The CAM device of claim 1, wherein:
  the at least one isolation circuit comprises at least one control insulated gate field effect transistor (IGFET) having a source-drain path coupled between the precharge voltage node and the at least one bit line, and a gate coupled to the control node.

3. The CAM device of claim 2, wherein:
  the at least one control IGFET includes a p-channel IGFET and the precharge voltage node is a high power supply voltage node.

4. The CAM device of claim 2, wherein:
  the at least one isolation circuit includes at least one supply IGFET having a source-drain path coupled in series with the at least one control IGFET.

5. The CAM device of claim 4, wherein:
  the at least one isolation circuit includes the at least one control IGFET having a source-drain path coupled in series with source-drain paths of plurality of supply IGFETs at a common supply node, each supply IGFET having a source-drain path coupled to a different bit line.

6. The CAM device of claim 5, wherein:
the at least one control IGFET comprises a plurality of control IGFETs arranged in parallel with one another between the precharge voltage node and the common supply node, each control IGFET being separately configurable to be enabled or disabled.

7. The CAM device of claim 4, wherein:
the at least one supply IGFET has a gate coupled to a power supply node.

8. The CAM device of claim 1, wherein:
the plurality of bit lines includes bit line pairs, each bit line pair being coupled to storage circuits of CAM cells in the corresponding column; and
at least one isolation circuit has controllable impedance paths between at least one of the bit line pairs and the precharge voltage node.

9. The CAM device of claim 8, wherein:
the at least one isolation circuit further includes an equalization IGFET having a source-drain path coupled between the one bit line pair.

10. The CAM device of claim 1, wherein:
the storage circuits of the CAM cells are selected from the group consisting of: value storage circuits that store a value for comparison with an applied compare data value, mask value storage circuits that selectively enable a comparison operation between a compare data value and a stored value, and XY storage circuits that store values for comparison with applied compare data value and that selectively mask comparison operations with the compare data values.

11. The CAM device of claim 1, wherein:
the control circuit comprises an instruction decoder that activates an access indication in response to an access operation.

12. The CAM device of claim 11, wherein:
the control circuit further includes an isolation signal generating circuit that changes an isolation signal in response to at least the access indication; and
the at least one isolation circuit switches between high and low impedance states in response to the isolation signal.

13. The CAM device of claim 12, wherein:
the isolation signal generating circuit switches the isolation signal in response to at least the access indication and a periodic timing signal.

14. The CAM device of claim 1, wherein:
the plurality of bit lines are logically divided into groups, each group of bit lines being coupled to storage circuits of CAM cells of a different CAM block;
the at least one isolation circuit includes a different isolation circuit corresponding to each group of bit lines, each isolation circuit having a controllable impedance path between at least one of the bit lines of the corresponding group of bit lines and the precharge voltage node, each isolation circuit being controlled by application of a potential at a corresponding one of a plurality of control nodes; and
the control circuit selectively switches the isolation circuits from the high impedance state to the low impedance state no later than at the start of an access operation to the CAM block of the corresponding bit line group, and in response to a block access indication.

15. The CAM device of claim 1, wherein:
the storage circuits of CAM cells comprise storage elements selected from the group of: at least one static random access memory (SRAM) cell, at least one dynamic RAM (DRAM) cell, and at least one nonvolatile memory cell.

16. A method of isolating bit lines in a CAM device, comprising:
isolating a plurality of bit lines from a precharge potential prior to receiving command data;
decoding received command data to determine if storage circuits within CAM cells are to be accessed or are not to be accessed, each CAM cell including compare circuitry for comparing a received comparand value to a value stored within the storage circuits;
if the storage cells within the CAM cells are to be accessed, coupling bit lines corresponding to the CAM cells to the precharge potential at least prior to accessing the CAM cells;
maintaining the coupling for a duration of at least a portion of the accessing the CAM cells; and
if the storage cells within the CAM cells are not to be accessed, continuing to isolate the bit lines from the precharge potential.

17. The method of claim 16, wherein:
the precharge potential is a high power supply voltage of the CAM device.

18. The method of claim 16, wherein:
the precharge potential is a potential between a high power supply voltage and a low power supply voltage of the CAM device.

19. The method of claim 16, wherein:
isolating the plurality of bit lines from the precharge potential includes placing at least one control transistor having a source-drain path between at least one of the bit lines and the precharge potential into a high impedance state.

20. The method of claim 19, wherein:
the CAM device includes a first supply node that provides a first power supply voltage, a second supply node that provides a second power supply voltage, and a third supply node that provides a third power supply voltage outside a range between the first and second power supply voltages; and
placing at least one control transistor into the high impedance state includes coupling the gate of the control transistor to the third supply node.

21. The method of claim 16, wherein:
determining if storage circuits within CAM cells are to be accessed includes determining if read command or write command data has been received.

22. The CAM device of claim 16, wherein:
determining if storage circuits within CAM cells are not to be accessed includes determining if search command data has been received.

23. A content addressable memory (CAM) device, comprising:
a plurality of CAM cells, each comprising at least a first store circuit coupled to at least a first bit line by at least a first access device;
at least one match line coupled to a row of CAM cells that provides a match indication based on compare results between a comparand value and values stored in a row of the CAM cells;
at least a first isolation device coupled between at least one first bit line and a precharge voltage node that provides high and low impedance paths in response to inactive and active isolation signal levels, respectively; and
a control circuit responsive to command data configured to change the isolation signal from the inactive level to the active level prior to and for a duration of at least a portion of enabling the first access devices of a row of CAM cells.

24. The CAM device of claim 23, wherein:
the at least first isolation device comprises a control transistor having a source-drain path coupled between the precharge voltage node and at least one first bit line, and a gate coupled to receive the isolation signal.

25. The CAM device of claim 24, further including:
a plurality of pass transistors, each having a source-drain path coupled between a different first bit line and one source-drain path of the control transistor.

26. The CAM device of claim 23, wherein:
the plurality of CAM cells comprise ternary CAM (TCAM) cells, each TCAM cell further including a second value store coupled to at least a second bit line by a second access device;
the at least first isolation device includes a second isolation device coupled between at least one second bit line and the precharge voltage node that provides high and low impedance paths in response to inactive and active second isolation signal levels, respectively; and
the control circuit changes the second isolation signal from the inactive level to the active level prior to enabling the first access devices of a row of CAM cells independently of changes in the first isolation signal.

27. The system of claim 23, wherein:
the plurality of CAM cells includes a number of CAM cell groups;
the at least first isolation device includes isolation devices corresponding to each CAM cell group, each isolation device of a different CAM cell group providing high and low impedance paths in response to inactive and active levels of an isolation signal for the CAM cell group; and
the control circuit changes precharge signals for each different CAM cell group from the inactive level to the active level in a sequential fashion prior to enabling the first access devices of a row of CAM cells.

* * * * *